(12) United States Patent
Hashimoto et al.

(10) Patent No.: US 11,728,267 B2
(45) Date of Patent: Aug. 15, 2023

(54) SEMICONDUCTOR MEMORY DEVICE

(71) Applicant: Kioxia Corporation, Tokyo (JP)

(72) Inventors: Toshifumi Hashimoto, Fujisawa (JP); Jumpei Sato, Kawasaki (JP)

(73) Assignee: Kioxia Corporation, Tokyo (JP)

(*) Notice: Subject to any disclaimer, the term of this patent is extended or adjusted under 35 U.S.C. 154(b) by 22 days.

(21) Appl. No.: 17/159,426

(22) Filed: Jan. 27, 2021

(65) Prior Publication Data
US 2021/0343644 A1 Nov. 4, 2021

(30) Foreign Application Priority Data

May 1, 2020 (JP) .................................. 2020-080978

(51) Int. Cl.
| | |
|---|---|
| *H01L 23/528* | (2006.01) |
| *H01L 23/522* | (2006.01) |
| *H10B 43/35* | (2023.01) |
| *H10B 43/40* | (2023.01) |
| *H10B 41/35* | (2023.01) |

(Continued)

(52) U.S. Cl.
CPC ...... *H01L 23/5283* (2013.01); *H01L 23/5226* (2013.01); *H01L 23/53209* (2013.01); *H10B 43/35* (2023.02); *H10B 43/40* (2023.02); *H10B 41/35* (2023.02); *H10B 41/40* (2023.02)

(58) Field of Classification Search
CPC ......... G11C 14/00; G11C 16/10; G11C 16/32; H01L 27/11519; H01L 27/11529; H01L 27/11556; H01L 23/5283; H01L 23/5226; H01L 23/53209; H01L 27/1157; H01L 27/11573; H01L 27/11524; H01L 27/11526; H01L 27/11565; H01L 27/11575; H01L 27/11582; H10B 45/35; H10B 43/40; H10B 41/35; H10B 41/40
See application file for complete search history.

(56) References Cited

U.S. PATENT DOCUMENTS 6,329,681 B1 * 12/2001 Nakamura ........ H01L 21/76843
257/E21.507
10,672,782 B2 6/2020 Utsumi
(Continued)

FOREIGN PATENT DOCUMENTS

CN 111081712 A 4/2020
JP 2018-26518 A 2/2018

*Primary Examiner* — Galina G Yushina
(74) *Attorney, Agent, or Firm* — Oblon, McClelland, Maier & Neustadt, L.L.P.

(57) ABSTRACT

A semiconductor memory device is provided that includes a plurality of memory blocks, arranged in a second direction, that are spaced from a semiconductor substrate in a first direction intersecting with a surface of the semiconductor substrate; a first wiring that is farther from the semiconductor substrate than the plurality of memory blocks in the first direction; a second wiring that is closer to the semiconductor substrate than the plurality of memory blocks in the first direction; a first contact; a first transistor with a first active region disposed in the semiconductor substrate, the second wiring being electrically connected to a first memory block among the plurality of memory blocks via the first transistor; and a second transistor where the second wiring being electrically connected to a second memory block among the plurality of memory blocks via the second transistor.

14 Claims, 21 Drawing Sheets

(51) Int. Cl.
*H10B 41/40* (2023.01)
*H01L 23/532* (2006.01)

(56) References Cited

U.S. PATENT DOCUMENTS

| | | | |
|---|---|---|---|
| 2015/0303209 A1* | 10/2015 | Park | H01L 27/11573 257/316 |
| 2019/0043836 A1 | 2/2019 | Fastow et al. | |
| 2019/0043868 A1 | 2/2019 | Hasnat et al. | |
| 2020/0126622 A1* | 4/2020 | Utsumi | H01L 27/11582 |
| 2020/0152573 A1* | 5/2020 | Oh | H01L 27/1157 |

* cited by examiner

SEMICONDUCTOR MEMORY DEVICE

CROSS-REFERENCE TO RELATED APPLICATIONS

This application is based upon and claims the benefit of Japanese Patent Application No. 2020-080978, filed on May 1, 2020, the entire contents of which are incorporated herein by reference.

BACKGROUND

Field

Embodiments described herein relate generally to a semiconductor memory device.

Description of the Related Art

There has been known a semiconductor memory device that includes a semiconductor substrate, a plurality of memory blocks spaced from the semiconductor substrate in a first direction intersecting with a surface of the semiconductor substrate and arranged in a second direction intersecting with the first direction, and a plurality of transistors disposed on the semiconductor substrate and connected to the plurality of memory blocks via a plurality of wirings.

DETAILED DESCRIPTION

Figure 1:
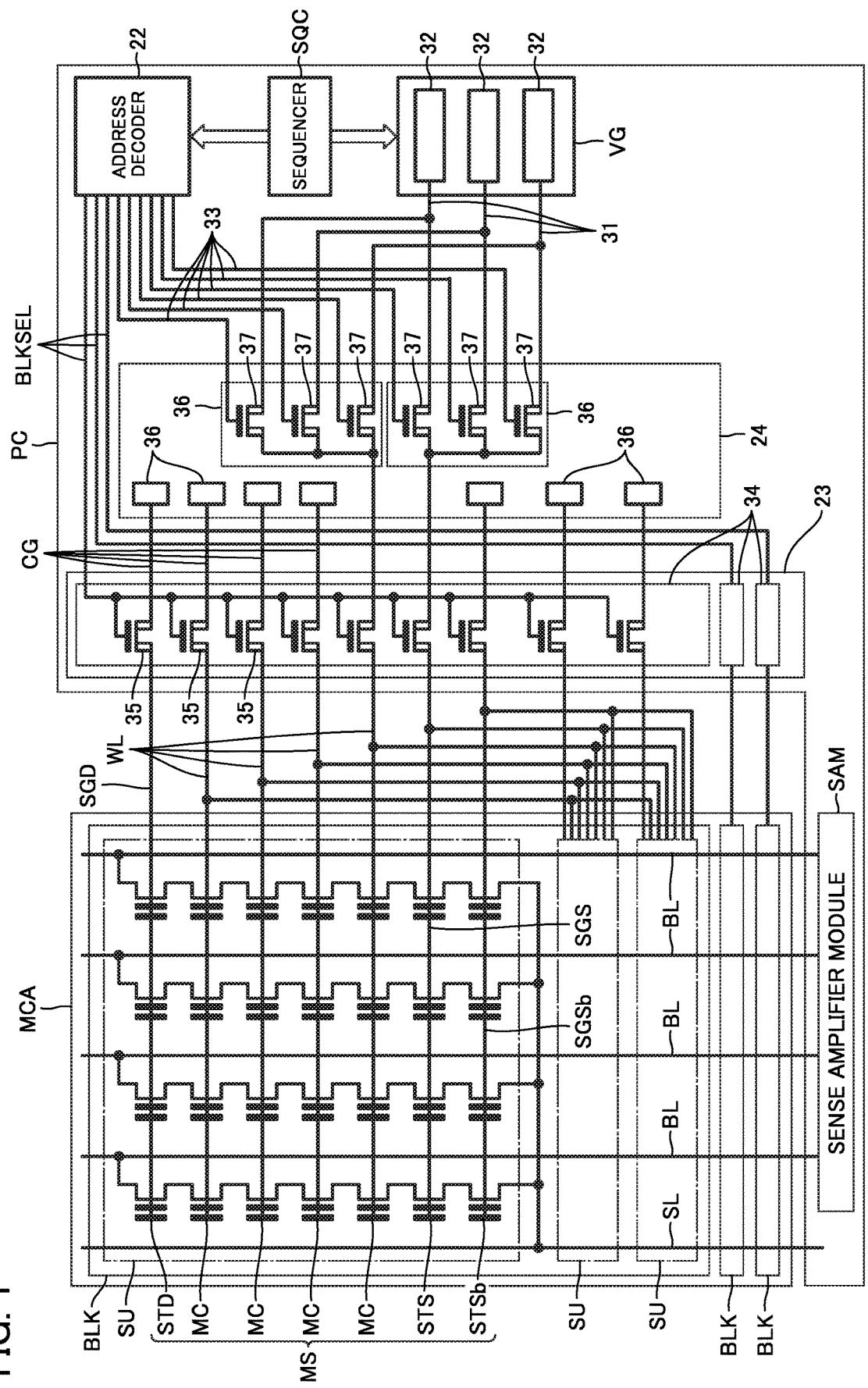
FIG. 1 is a schematic circuit diagram illustrating a configuration of a semiconductor memory device according to a first embodiment.

A semiconductor memory device according to one embodiment includes: a semiconductor substrate; a plurality of memory blocks spaced from the semiconductor substrate in a first direction intersecting with a surface of the semiconductor substrate, the plurality of memory blocks being arranged in a second direction intersecting with the first direction; a first wiring that is farther from the semiconductor substrate than the plurality of memory blocks in the first direction; a second wiring that is closer to the semiconductor substrate than the plurality of memory blocks in the first direction; a first contact electrically connected between the first wiring and the second wiring; a first transistor disposed on the semiconductor substrate, the first transistor being electrically connected between the second wiring and a first memory block among the plurality of memory blocks; and a second transistor disposed on the semiconductor substrate, the second transistor being electrically connected between the second wiring and a second memory block among the plurality of memory blocks. The first contact is disposed between the first transistor and the second transistor in the second direction.

Next, the semiconductor memory device according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to "semiconductor memory device," it may mean a memory die and may mean a memory system including a control die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

In this specification, a direction parallel to an upper surface of a substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X-direction, the Y-direction, and the Z-direction and need not to correspond to these directions.

Expressions, such as "above" and "below," in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, a part of a surface of a member connected to another member may be referred to as a "connecting surface".

First Embodiment

FIG. 1 is a schematic circuit diagram illustrating a part of a configuration of a semiconductor memory device according to the first embodiment.

As illustrated in FIG. 1, a memory die MD includes a memory cell array MCA that stores data and a peripheral circuit PC connected to the memory cell array MCA.

The memory cell array MCA includes a plurality of memory blocks BLK. The plurality of memory blocks BLK each include a plurality of string units SU. The plurality of string units SU each include a plurality of memory strings MS. The plurality of memory strings MS have one ends each connected to the peripheral circuit PC via a bit line BL. The plurality of memory strings MS have the other ends each connected to the peripheral circuit PC via a common source line SL.

The memory string MS includes a drain-side select transistor STD, a plurality of memory cells MC (memory transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type transistor including a semiconductor layer that functions as a channel region, a gate insulating film including an electric charge accumulating film, and a gate electrode. The memory cell MC has a threshold voltage that changes according to an electric charge amount in the electric charge accumulating film. The memory cell MC stores one bit or a plurality of bits of data. Word lines WL are connected to respective gate electrodes of the plurality of memory cells MC corresponding to one memory string MS. These word lines WL are each connected to all of the memory strings MS in one memory block BLK in common.

The select transistor (STD, STS, STSb) is a field-effect type transistor including a semiconductor layer that functions as a channel region, a gate insulating film, and a gate electrode. Select gate lines (SGD, SGS, SGSb) are connected to the respective gate electrodes of the select transistors (STD, STS, STSb). The drain-side select gate line SGD is disposed corresponding to the string unit SU and connected to all of the memory strings MS in one string unit SU in common. The source-side select gate line SGS is connected to all of the memory strings MS in a plurality of string units SU in common. The source-side select gate line SGSb is connected to all of the memory strings MS in the plurality of string units SU in common.

The peripheral circuit PC includes a voltage generate circuit VG, an address decoder 22, a block select circuit 23 and a voltage select circuit 24 that transfer an operating voltage to the memory cell array MCA in response to an output signal from the address decoder 22, a sense amplifier module SAM, and a sequencer SQC.

The voltage generate circuit VG is connected to a plurality of voltage supply lines 31. The voltage generate circuit VG includes, for example, a step down circuit, such as a regulator, and a step up circuit, such as a charge pump circuit 32. A power supply voltage and a ground voltage are supplied to each of these step down circuit and step up circuit. For example, the voltage generate circuit VG generates a plurality of patterns of operating voltages applied to the bit line BL, the source line SL, the word line WL, and the select gate line (SGD, SGS, SGSb) in a read operation, a write operation, and an erase operation on the memory cell array MCA, in accordance with a control signal from the sequencer SQC to simultaneously output the operating voltages to the plurality of voltage supply lines 31. The operating voltage output from the voltage supply line 31 is appropriately adjusted in accordance with the control signal from the sequencer SQC.

The address decoder 22 includes a plurality of block select lines BLKSEL and a plurality of voltage select lines 33. For example, the address decoder 22 sequentially refers to a row address in the address register in response to the control signal from the sequencer SQC, decodes this row address to cause predetermined block select transistor 35 and voltage select transistors 37 corresponding to the row address to be in a state of ON, and cause the block select transistors 35 and the voltage select transistors 37 other than the above to be in a state of OFF. For example, voltages of the predetermined block select line BLKSEL and voltage select line 33 are set to be in a state of "H" and voltages other than those are set to be in a state of "L." When a P channel type transistor is used, not an N channel type transistor, an inverse voltage is applied to these wirings.

In the illustrated example, in the address decoder 22, one block select line BLKSEL is disposed per memory block BLK. However, this configuration is appropriately changeable. For example, one block select line BLKSEL may be included in per two or more memory blocks BLK.

The block select circuit 23 includes a plurality of block selectors 34 corresponding to the memory blocks BLK. The plurality of block selectors 34 each include a plurality of the block select transistors 35 corresponding to the word lines WL and the select gate lines (SGD, SGS, SGSb). The block select transistor 35 is, for example, a field-effect type high voltage transistor. The block select transistors 35 have source electrodes each electrically connected to the corresponding word line WL or select gate line (SGD, SGS, SGSb). The drain electrodes are each electrically connected to the voltage supply line 31 via a wiring CG and the voltage select circuit 24. The gate electrodes are commonly connected to the corresponding block select line BLKSEL.

Note that the block select circuit 23 further includes a plurality of transistors (not illustrated). The plurality of transistors are field-effect type high voltage transistors connected between the select gate lines (SGD, SGS, SGSb) and the voltage supply lines to which the ground voltage is supplied. The plurality of transistors supply the select gate lines (SGD, SGS, SGSb) included in the non-selected memory blocks BLK with the ground voltage. Note that the plurality of word lines WL included in the non-selected memory blocks BLK enter a floating state.

The voltage select circuit 24 includes a plurality of voltage selectors 36 corresponding to the word lines WL and the select gate lines (SGD, SGS, SGSb). The plurality of voltage selectors 36 each include a plurality of the voltage select transistors 37. The voltage select transistor 37 is, for example, a field-effect type high voltage transistor. The voltage select transistors 37 have source terminals each electrically connected to the corresponding word line WL or the select gate line (SGD, SGS, SGSb) via the wiring CG and the block select circuit 23. The drain terminals are each electrically connected to the corresponding voltage supply line 31. The gate electrodes are each connected to the corresponding voltage select line 33.

The illustrated example illustrates an example in which the wiring CG is connected to the voltage supply line 31 via one voltage select transistor 37. However, such a configuration is merely an example, and the specific configurations are appropriately adjustable. For example, the wirings CG may be connected to the voltage supply line 31 via the two or more voltage select transistors 37.

The sense amplifier module SAM includes, for example, a plurality of sense amplifier units corresponding to the plurality of bit lines BL. The sense amplifier units each include a sense amplifier connected to the bit line BL. The sense amplifier includes a sense circuit connected to the bit line BL, a voltage transfer circuit connected to the bit line BL, and a latch circuit connected to the sense circuit and the voltage transfer circuit. The sense circuit includes a sense transistor that turns ON according to a voltage or a current of the bit line BL and a wiring charged or discharged according to the ON/OFF state of the sense transistor. The latch circuit latches data of "1" or "0" according to the voltage of this wiring. According to the data latched to this latch circuit, the voltage transfer circuit electrically conducts the bit line BL with any of two voltage supply lines.

In response to command data held in a command register, the sequencer SQC outputs an internal control signal that controls the voltage generate circuit VG, the address decoder 22, the block select circuit 23, the voltage select circuit 24, and the sense amplifier module SAM.

[Structure of Memory Die MD]

Figure 2:
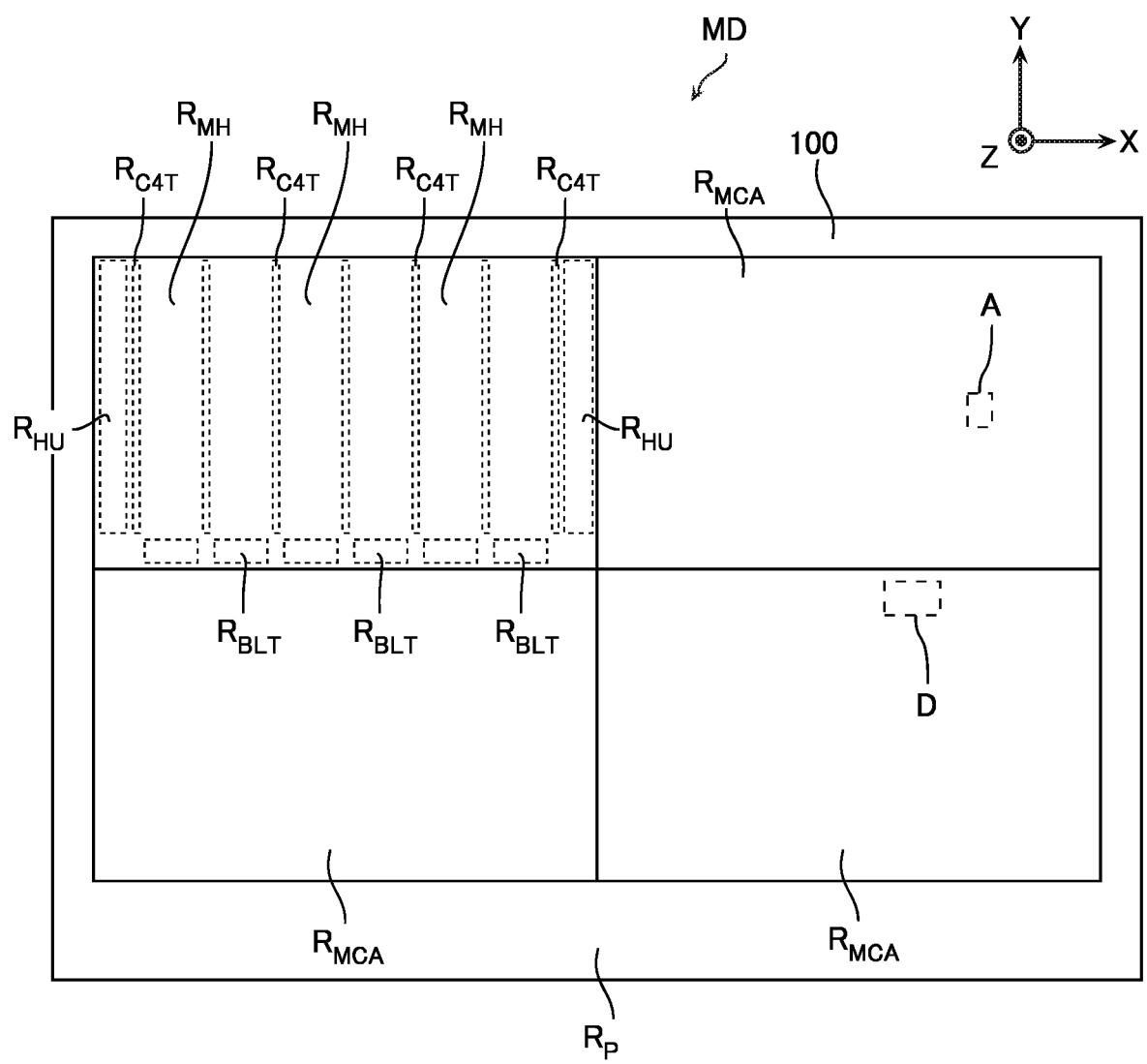
FIG. 2 is a schematic plan view of a memory die MD according to the embodiment.
Figure 3:
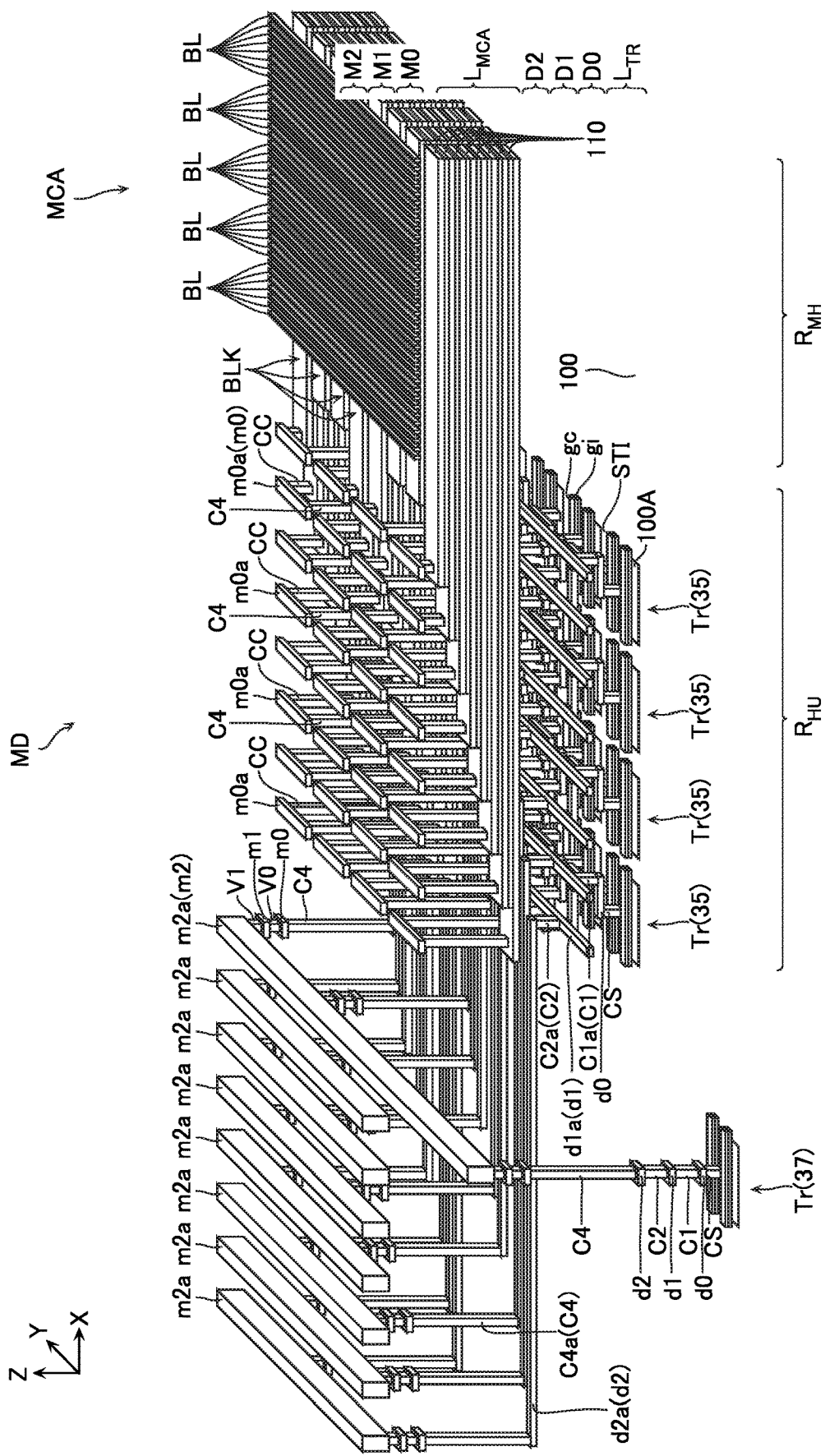
FIG. 3 is a schematic perspective view of the memory die MD.
Figure 4:
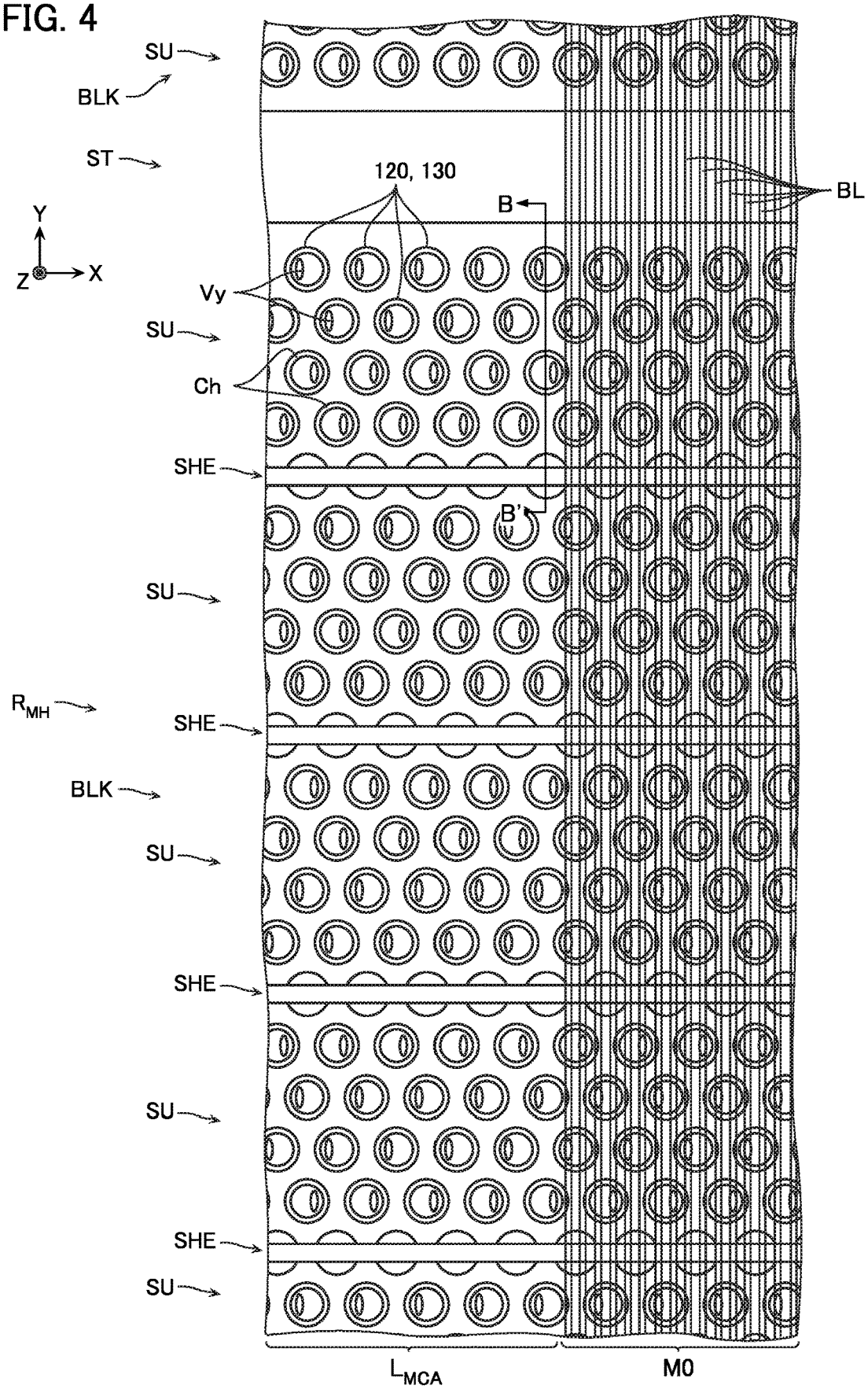
FIG. 4 is a schematic enlarged view of a part indicated by A in FIG. 2.
Figure 5:
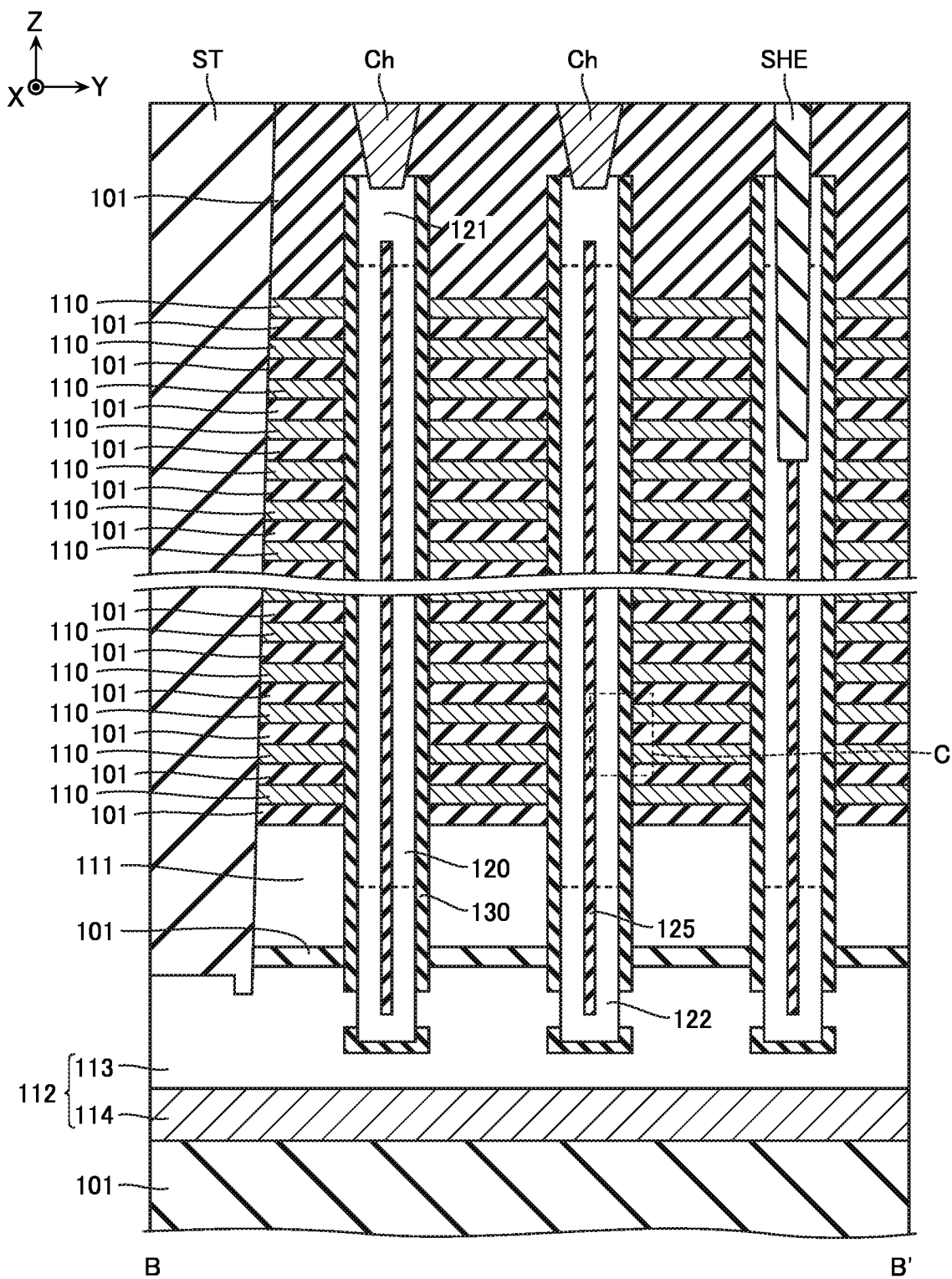
FIG. 5 is a schematic cross-sectional view of a structure illustrated in FIG. 4 taken along the line B-B' and viewed along the arrow direction.
Figure 6:
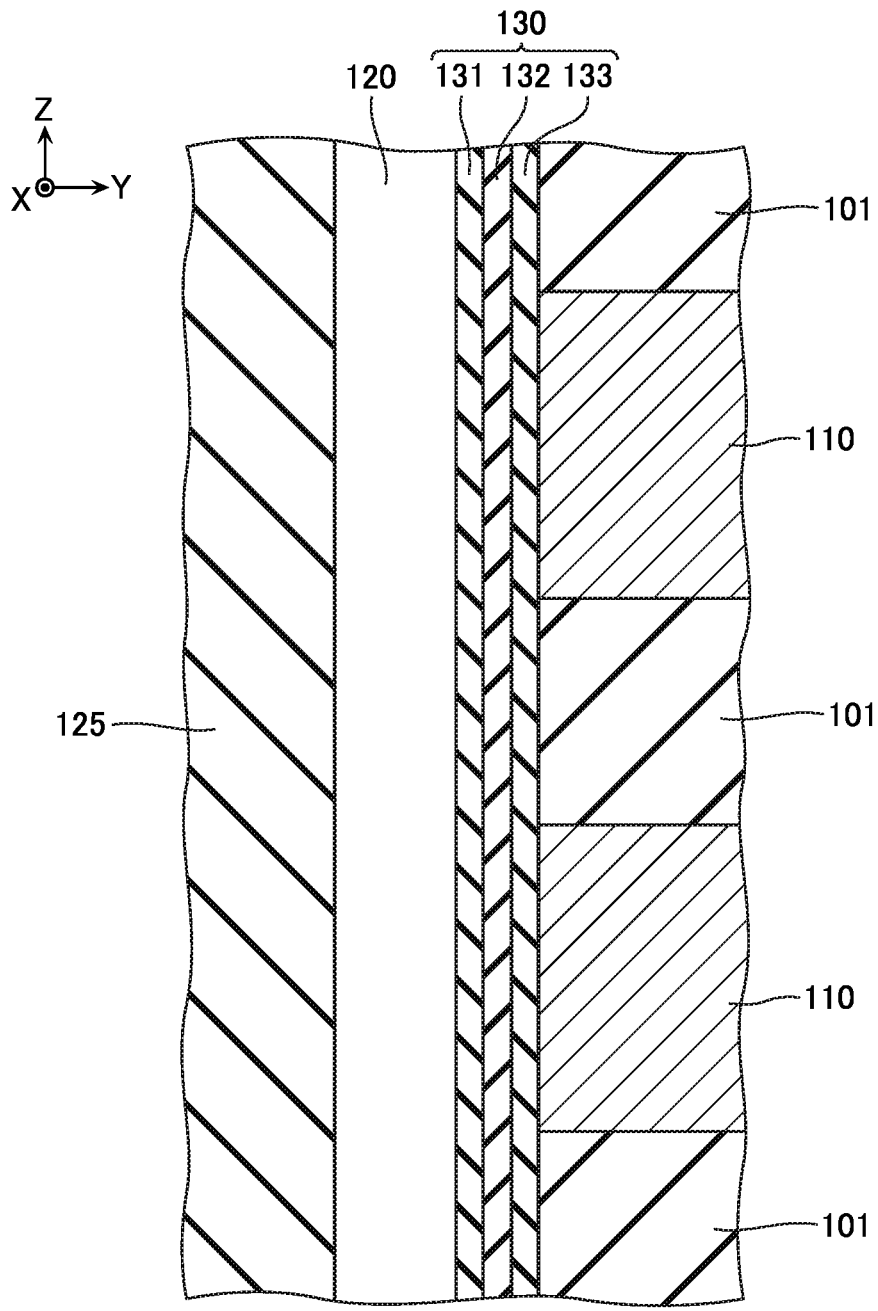
FIG. 6 is a schematic enlarged view of a part indicated by C in FIG. 5.
Figure 7:
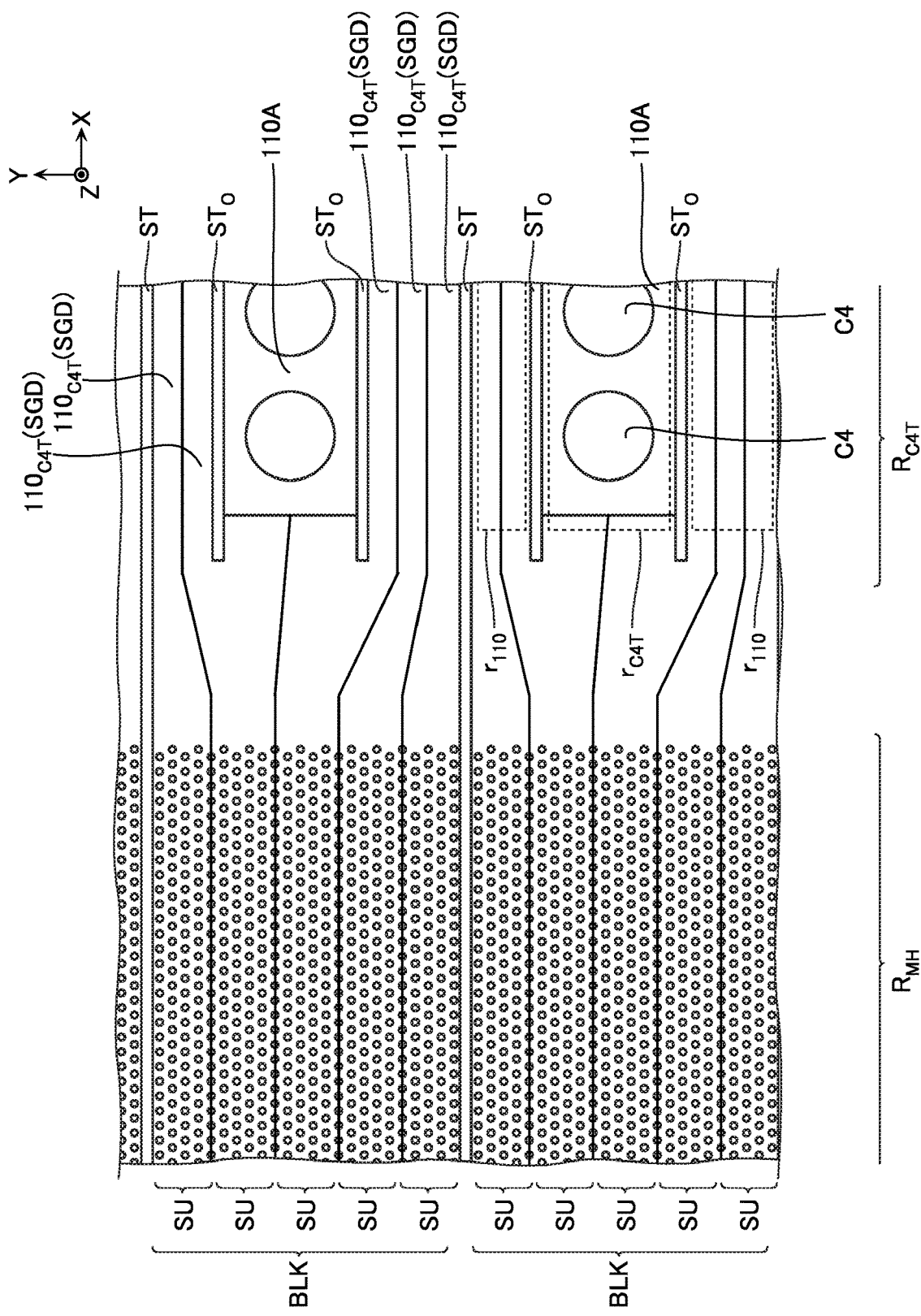
FIG. 7 is a schematic enlarged view of a part indicated by D in FIG. 2.

FIG. 2 is a schematic plan view of the memory die MD. FIG. 3 is a schematic perspective view illustrating a configuration of a part of the memory die MD. FIG. 4 is a schematic enlarged view of a part indicated by A in FIG. 2. FIG. 5 is a schematic cross-sectional view of a structure illustrated in FIG. 4 taken along the line B-B' and viewed along the arrow direction. FIG. 6 is a schematic enlarged view of a part indicated by C in FIG. 5. FIG. 7 is a schematic enlarged view of a part indicated by D in FIG. 2.

Note that FIG. 3 to FIG. 7 are drawings to describe the schematic configuration of the memory die MD and do not describe the specific number of configurations, shape, arrangement, or the like. For example, in the example of FIG. 3, each memory block BLK includes eight conductive layers 110 arranged in the Z-direction. However, for example, as illustrated in FIG. 5 as an example, the memory block BLK may include nine or more conductive layers 110. For example, in the example of FIG. 4, the bit lines BL are disposed in only a part of a region of a memory hole region $R_{MH}$ described later. However, the bit lines BL are disposed in the entire memory hole region $R_{MH}$.

For example, as illustrated in FIG. 2, the memory die MD includes a semiconductor substrate 100. In the illustrated example, the semiconductor substrate 100 includes four memory cell array regions $R_{MCA}$ arranged in the X-direction and the Y-direction. The memory cell array region $R_{MCA}$ includes a plurality of memory hole regions $R_{MH}$ arranged in the X-direction and a plurality of contact connect regions $R_{C4T}$ disposed between the memory hole regions $R_{MH}$. Hook-up regions $R_{HU}$ arranged in the X-direction are disposed on both end portions in the X-direction of the memory cell array region $R_{MCA}$. These regions extend in the Y-direction. Additionally, a plurality of contact connect regions $R_{BLT}$ arranged in the X-direction corresponding to the plurality of memory hole regions $R_{MH}$ arranged in the X-direction are disposed on one end portion in the Y-direction of the memory cell array region $R_{MCA}$. A peripheral region $R_P$ is disposed in an end portion in the Y-direction of the semiconductor substrate 100. The peripheral region $R_P$ extends in the X-direction along the end portion in the Y-direction of the semiconductor substrate 100.

In the illustrated example, the hook-up regions $R_{HU}$ are disposed in both end portions in the X-direction of the memory cell array region $R_{MCA}$. However, such a configuration is merely an example, and the specific configurations are appropriately adjustable. For example, the hook-up region $R_{HU}$ may be disposed in one end portion in the X-direction of the memory cell array region $R_{MCA}$, not both end portions in the X-direction. Alternatively, the hook-up region $R_{HU}$ may be disposed at the center position or a position near the center in the X-direction of the memory cell array region $R_{MCA}$.

For example, as illustrated in FIG. 3, the memory die MD includes the semiconductor substrate 100, a transistor layer $L_{TR}$ disposed on the semiconductor substrate 100, a wiring layer D0 disposed above the transistor layer $L_{TR}$, a wiring layer D1 disposed above the wiring layer D0, a wiring layer D2 disposed above the wiring layer D1, a memory cell array layer $L_{MCA}$ disposed above the wiring layer D2, a wiring layer M0 disposed above the memory cell array layer $L_{MCA}$, a wiring layer M1 disposed above the wiring layer M0, and a wiring layer M2 disposed above the wiring layer M1.

[Structure of Semiconductor Substrate 100]

The semiconductor substrate 100 is, for example, a semiconductor substrate made of P type silicon (Si) containing P type impurities, such as boron (B). For example, as illustrated in FIG. 3, on the surface of the semiconductor substrate 100, a plurality of active regions 100A and an insulating layer STI disposed between the two active regions 100A adjacent in the X-direction or the Y-direction are disposed. The active region 100A contains N-type impurities, such as phosphorus (P), and P-type impurities, such as boron (B). The respective plurality of active regions 100A function as a part of a plurality of transistors Tr or the like constituting the peripheral circuit PC.

[Structure of Transistor Layer $L_{TR}$]

For example, as illustrated in FIG. 3, a plurality of gate insulating films gi are disposed on the upper surface of the semiconductor substrate 100. Gate electrodes gc are disposed on the upper surfaces of the plurality of gate insulating films gi. The respective regions of the semiconductor substrate 100 and the plurality of gate electrodes gc are each connected to contact CS.

The respective plurality of gate electrodes gc function as gate electrodes of the plurality of transistors Tr or the like constituting the peripheral circuit PC. For example, the gate electrode gc may include a stacked film of a barrier conductive film, such as titanium nitride (TiN), and a metal film, such as tungsten (W), or the like.

The contact CS extends in the Z-direction and has a lower end connected to the semiconductor substrate 100 or the upper surface of the gate electrode gc. An impurity region containing N-type impurities or P-type impurities is disposed in a connecting part between the contact CS and the semiconductor substrate 100. For example, the contact CS may include a stacked film of a barrier conductive film, such as titanium nitride (TiN), and a metal film, such as tungsten (W), or the like.

[Structures of Wiring Layers D0, D1, D2]

For example, as illustrated in FIG. 3, a plurality of wirings included in the wiring layers D0, D1, D2 are electrically connected to at least one of configurations in the memory cell array MCA or configurations in the peripheral circuit PC.

The wiring layers D0, D1, D2 include a plurality of wirings d0, d1, d2, respectively. For example, the plurality of wirings d0, d1, d2 may include a stacked film of a barrier conductive film, such as titanium nitride (TiN), and a metal film, such as tungsten (W), or the like.

Between the wiring d0 and the wiring d1, a contact C1 extending in the Z-direction is disposed. Between the wiring d1 and the wiring d2, a contact C2 extending in the Z-direction is disposed. For example, the contacts C1, C2 may include a stacked film of a barrier conductive film, such as titanium nitride (TiN), and a metal film, such as tungsten (W), or the like.

[Structure of Memory Cell Array Layer $L_{MCA}$ in Memory Hole Region $R_{MH}$]

For example, as illustrated in FIG. 3, the plurality of memory blocks BLK arranged in the Y-direction are disposed in the memory cell array layer $L_{MCA}$. For example, as illustrated in FIG. 4, the memory block BLK includes the plurality of string units SU arranged in the Y-direction. An inter-block insulating layer ST, such as silicon oxide ($SiO_2$), is disposed between the two memory blocks BLK adjacent in the Y-direction. An inter-string unit insulating layer SHE, such as silicon oxide ($SiO_2$), is disposed between the two string units SU adjacent in the Y-direction.

For example, as illustrated in FIG. 5, the memory block BLK includes the plurality of conductive layers 110 arranged in the Z-direction, a plurality of semiconductor layers 120 extending in the Z-direction, and respective plurality of gate insulating films 130 disposed between the plurality of conductive layers 110 and the plurality of semiconductor layers 120.

The conductive layer 110 is a substantially plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z-direction, insulating layers 101, such as silicon oxide ($SiO_2$), are disposed.

A conductive layer 111 is disposed below the conductive layer 110. For example, the conductive layer 111 may contain polycrystalline silicon containing impurities, such as phosphorus (P) or boron (B), or the like. Between the conductive layer 111 and the conductive layer 110, the insulating layer 101, such as silicon oxide ($SiO_2$), is disposed.

A conductive layer 112 is disposed below the conductive layers 111. The conductive layer 112 includes a semiconductor layer 113 connected to lower ends of the semiconductor layers 120 and a conductive layer 114 connected to a lower surface of the semiconductor layer 113. For example, the semiconductor layer 113 may contain polycrystalline silicon containing impurities, such as phosphorus (P) and boron (B), or the like. The conductive layer 114 may include, for example, a conductive layer of a metal, such as tungsten (W), tungsten silicide, or the like, or another conductive layer. Between the conductive layer 112 and the conductive layers 111, the insulating layers 101, such as silicon oxide ($SiO_2$), are disposed.

The conductive layer 112 functions as the source line SL (FIG. 1). The source line SL is, for example, disposed in common corresponding to all of the memory blocks BLK included in the memory cell array region $R_{MCA}$ (FIG. 2).

The conductive layers 111 function as gate electrodes of the source-side select gate line SGSb (FIG. 1) and the plurality of source-side select transistors STSb connected to the source-side select gate line SGSb. The conductive layers 111 are electrically independent in every memory block BLK.

Among the plurality of conductive layers 110, one or a plurality of conductive layers 110 positioned at the lowermost function as the source-side select gate line SGS (FIG. 1) and gate electrodes of the plurality of source-side select transistors STS connected to the source-side select gate line SGS. The plurality of conductive layers 110 are electrically independent in every memory block BLK.

A plurality of conductive layers 110 positioned upward of this layer function as the word lines WL (FIG. 1) and gate electrodes of the plurality of memory cells MC (FIG. 1) connected to the word lines WL. The plurality of conductive layers 110 are each electrically independent in every memory block BLK.

One or a plurality of conductive layers 110 positioned upward of this layer function as the drain-side select gate line SGD and gate electrodes of the plurality of drain-side select transistors STD (FIG. 1) connected to the drain-side select gate line SGD. The plurality of conductive layers 110 have widths in the Y-direction smaller than those of the other conductive layers 110. Between the two conductive layers 110 adjacent in the Y-direction, the inter-string unit insulating layer SHE is disposed. The plurality of conductive layers 110 are each electrically independent in every string unit SU.

For example, as illustrated in FIG. 4, the semiconductor layers 120 are arranged in the X-direction and the Y-direction in a predetermined pattern. The semiconductor layers 120 function as the channel regions of the plurality of memory cells MC and the select transistors (STD, STS, STSb) included in one memory string MS (FIG. 1). The semiconductor layer 120 is, for example, a semiconductor layer, such as polycrystalline silicon (Si). For example, as illustrated in FIG. 5, the semiconductor layer 120 has a substantially closed-bottomed cylindrical shape and includes an insulating layer 125, such as silicon oxide, in the center part. The outer peripheral surfaces of the semiconductor layers 120 are each surrounded by the conductive layers 110 and are opposed to the conductive layers 110.

On the upper end portion of the semiconductor layer 120, an impurity region 121 containing N-type impurities, such as phosphorus (P), is disposed. The impurity region 121 is connected to the bit line BL via a contact Ch and a contact Vy (FIG. 4).

On the lower end portion of the semiconductor layer 120, an impurity region 122 containing N-type impurities, such as phosphorus (P), is disposed. The impurity region 122 is connected to the semiconductor layer 113 in the conductive layer 112. In the semiconductor layer 120, a part positioned immediately above the impurity region 122 functions as a channel region of the source-side select transistor STSb. The outer peripheral surface of the impurity region 122 is surrounded by the conductive layer 111 and is opposed to the conductive layer 111.

The gate insulating film 130 has a substantially closed-bottomed cylindrical shape that covers the outer peripheral surface of the semiconductor layer 120. The gate insulating film 130 includes, for example, as illustrated in FIG. 6, a tunnel insulating film 131, an electric charge accumulating film 132, and a block insulating film 133, which are stacked between the semiconductor layer 120 and the conductive layers 110. The tunnel insulating film 131 and the block insulating film 133 are, for example, insulating films, such as silicon oxide ($SiO_2$). The electric charge accumulating film 132 is, for example, a film that can accumulate an electric charge of silicon nitride ($Si_3N_4$) or the like. The tunnel insulating film 131, the electric charge accumulating film 132, and the block insulating film 133, which have substantially cylindrical shapes, extend in the Z-direction along the outer peripheral surface of the semiconductor layer 120.

FIG. 6 illustrates an example in which the gate insulating film 130 includes the electric charge accumulating film 132, such as silicon nitride. However, the gate insulating film 130 may include, for example, a floating gate of polycrystalline silicon containing N type or P type impurities or the like.

[Structure of Memory Cell Array Layer $L_{MCA}$ in Contact Connect Region $R_{C4T}$]

For example, as illustrated in FIG. 7, the contact connect region $R_{C4T}$ includes two insulating layers $ST_O$ arranged in the Y-direction between the two inter-block insulating layers ST arranged in the Y-direction. The insulating layer $ST_O$ contains, for example, silicon oxide ($SiO_2$). Between these two insulating layers $ST_O$, a contact connect sub-region $r_{C4T}$ is disposed. Between the inter-block insulating layer ST and the insulating layer $ST_O$, a conductive layer connect sub-region $r_{110}$ is disposed. These regions extend in the X-direction along the inter-block insulating layer ST.

The contact connect sub-region $r_{C4T}$ includes a plurality of contacts C4 arranged in the X-direction and insulating layers 110A that cover the outer peripheral surfaces of the plurality of contacts C4. The contact C4 may include a stacked film of a barrier conductive film, such as titanium nitride (TiN) and a metal film, such as tungsten (W), or the like. The contact C4 extends in the Z-direction, has an upper end connected to a wiring m0 in the wiring layer M0, and has a lower end connected to the wiring d2 in the wiring layer D2. The insulating layer 110A may include, for example, an insulating layer, such as silicon nitride (SiN).

The conductive layer connect sub-region $r_{110}$ includes a narrow-width portion $110_{C4T}$ of the conductive layers 110. The plurality of conductive layers 110 included in the two memory hole regions $R_{MH}$ adjacent in the X-direction are electrically conducted with one another via the narrow-width portion $110_{C4T}$. In the illustrated example, one of the two conductive layer connect sub-regions $r_{110}$ corresponding to one memory block BLK includes the narrow-width portions $110_{C4T}$ of the three conductive layers 110 that function as the drain-side select gate lines SGD. The other one of these two conductive layer connect sub-region $r_{110}$ includes the narrow-width portions $110_{C4T}$ of the two conductive layers 110 that function as the drain-side select gate lines SGD.

[Structure of Memory Cell Array Layer $L_{MCA}$ in Hook-Up Region $R_{HU}$]

As illustrated in FIG. 3, the hook-up region $R_{HU}$ includes a plurality of contacts CC and a plurality of contacts C4. A plurality of the contacts CC are provided corresponding to each of the memory blocks BLK. The plurality of the contacts CC corresponding to one of the memory blocks BLK are arranged in the X-direction. A plurality of the contacts C4 are provided corresponding to each of the memory blocks BLK. The plurality of the contacts C4 corresponding to one of the memory blocks BLK are arranged in the X-direction.

End portions in the X-direction of the plurality of conductive layers 110 are disposed in regions near the contacts CC. The plurality of end portions have positions in the X-direction different from one another. Thus, in the hook-up region $R_{HU}$, a structure having a substantially staircase pattern disposed corresponding to the memory blocks BLK is formed. Additionally, the plurality of contacts CC extend in the Z-direction and have lower ends connected to the end portions in the X-direction of the conductive layers 110. For example, the contact CC may include a stacked film of a barrier conductive film, such as titanium nitride (TiN), and a metal film, such as tungsten (W), or the like.

In the illustrated example, the plurality of contacts CC corresponding to one memory block BLK are arranged in a row in the X-direction. However, such a configuration is merely an example, and the specific configurations are appropriately adjustable. For example, the plurality of contacts CC corresponding to one memory block BLK may be arranged in two rows in the X-direction or may be arranged in three or more rows.

Similarly to the contact connect sub-region $r_{C4T}$ that has been described with reference to FIG. 7, the plurality of contacts C4 arranged in the X-direction and insulating layers (not illustrated) that cover the outer peripheral surfaces of the plurality of contacts C4 are disposed in a region near the contacts C4. As illustrated in FIG. 3, the contacts C4 extend in the Z-direction, have upper ends connected to the wirings m0 in the wiring layers M0, and have lower ends connected to the wirings d2 in the wiring layer D2.

[Structure of Memory Cell Array Layer $L_{MCA}$ in Contact Connect Region $R_{BLT}$]

The contact connect region $R_{BLT}$ (FIG. 2) includes a plurality of contacts. The plurality of contacts extend in the Z-direction, have upper ends connected to ones functioning as the bit lines BL among the wirings m0 in the wiring layer M0, and have lower ends connected to the wirings d2 in the wiring layer D2.

[Structures of Wiring Layers M0, M1, M2]

For example, as illustrated in FIG. 3, the plurality of wirings included in the wiring layers M0, M1, M2 are electrically connected to, for example, at least one of the configurations in the memory cell array $L_{MCA}$ and the configurations in the transistor layer $L_{TR}$.

The wiring layer M0 includes the plurality of wirings m0. For example, the plurality of wirings m0 may include a stacked film of a barrier conductive film, such as titanium nitride (TiN), and a metal film, such as copper (Cu), or the like. The plurality of wirings m0 basically extend in the Y-direction. Note that a part of the plurality of wirings m0 function as the bit lines BL (FIG. 1). For example, as illustrated in FIG. 4, the bit lines BL are arranged in the X-direction and extend in the Y-direction. The plurality of bit lines BL are each connected to one semiconductor layer 120 included in each string unit SU.

The wiring layer M1 includes the plurality of wirings m1. For example, the plurality of wirings m1 may include a stacked film of a barrier conductive film, such as titanium nitride (TiN), and a metal film, such as copper (Cu), or the like. The plurality of wirings m1 basically extend in the X-direction.

For example, as illustrated in FIG. 3, the wiring layer M2 includes the plurality of wirings m2. For example, the plurality of wirings m2 may include a stacked film of a barrier conductive film, such as titanium nitride (TiN), and a metal film, such as aluminum (Al), or the like. The plurality of wirings m2 basically extend in the Y-direction. Widths of the plurality of wirings m2 in the X-direction may be greater than widths of wirings d0, d1, d2 in the X-direction or the Y-direction (in the direction perpendicular to the direction in which the wirings d0, d1, d2 extend).

Between the wiring m0 and the wiring m1, a contact V0 extending in the Z-direction is disposed. Between the wiring m1 and the wiring m2, a contact V1 extending in the Z-direction is disposed. For example, the contacts V0, V1 may include a stacked film of a barrier conductive film, such as titanium nitride (TiN), and a metal film, such as copper (Cu) or aluminum (Al), or the like.

[Layout Patterns in Wiring Layers D0, D1, D2, M0, M1, M2]

As described with reference to FIG. 3, the memory blocks BLK each include the plurality of conductive layers 110 arranged in the Z-direction, and the respective plurality of conductive layers 110 are connected to the lower end portions of the contacts CC extending in the Z-direction. The respective contacts CC have upper end portions connected to a part of the plurality of wirings m0. Hereinafter, these wirings m0 are referred to as "wirings m0a" in some cases. The plurality of wirings m0a are arranged in the X-direction and the Y-direction corresponding to the contacts CC and each extend in the Y-direction. The plurality of wirings m0a are each connected to the contact C4 disposed in the hook-up region $R_{HU}$.

Figure 8:
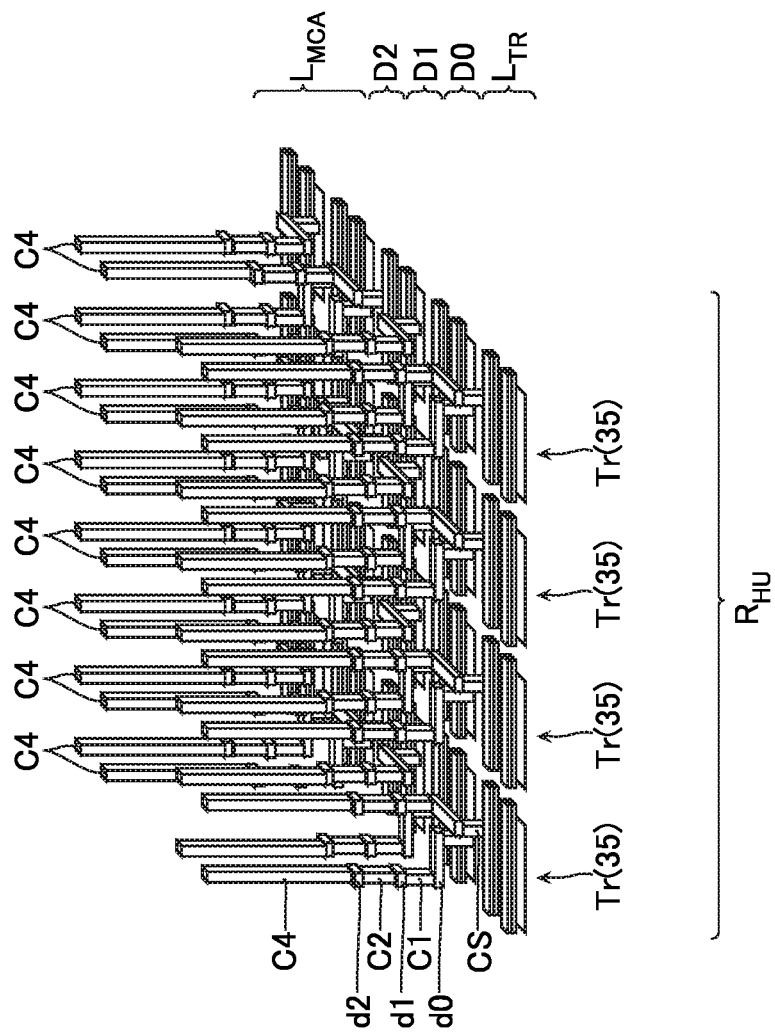
FIG. 8 is a schematic perspective view in which a part of a configuration is omitted from the structure illustrated in FIG. 3.

As illustrated in FIG. 8, the plurality of contacts C4 are connected to source regions of the plurality of transistors Tr disposed in the hook-up region $R_{HU}$ via conductive members such as the plurality of wirings d0, d1, d2 and the contacts CS, C1, C2. The plurality of transistors Tr each function as the block select transistor 35 (FIG. 1).

Figure 9:
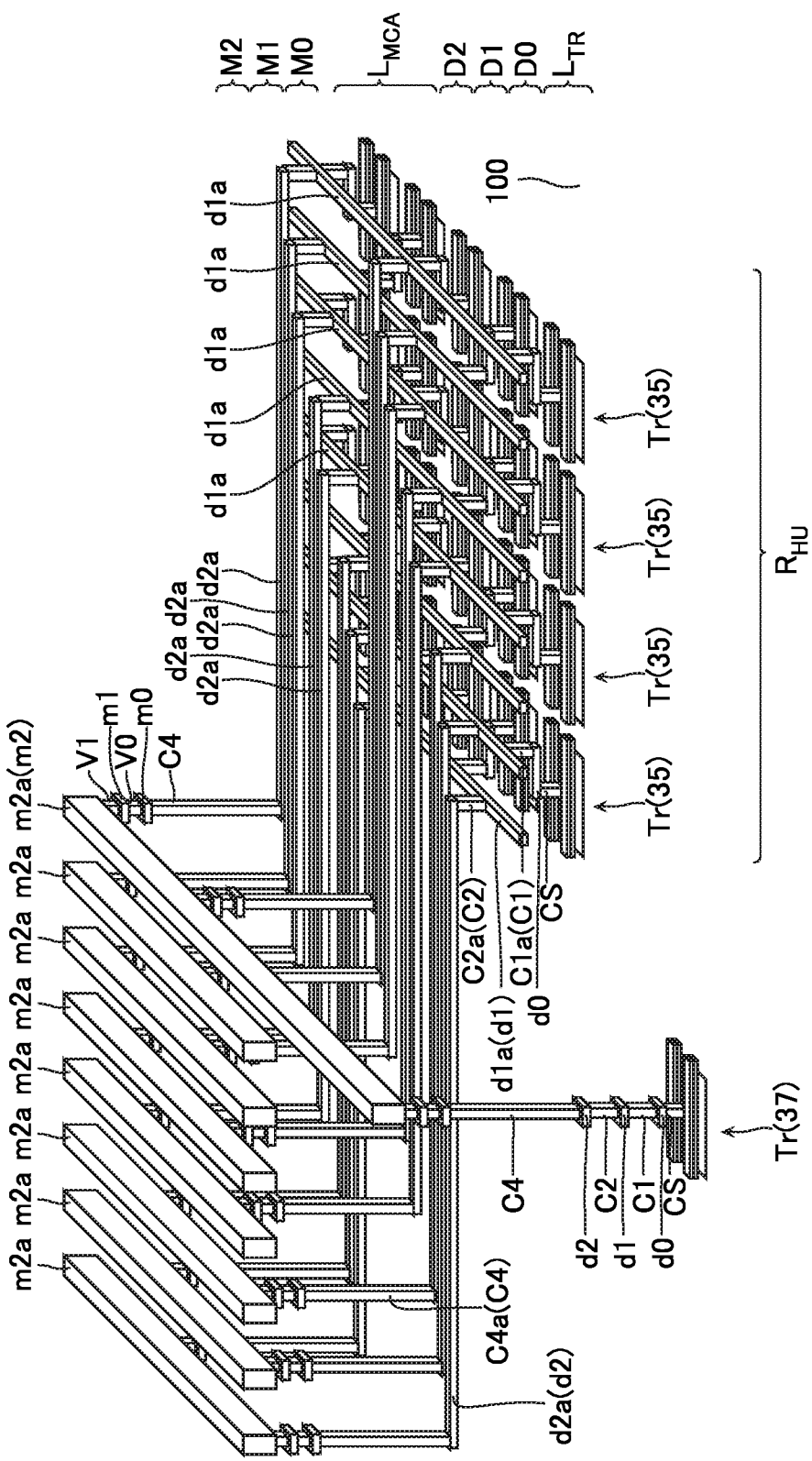
FIG. 9 is a schematic perspective view in which a part of a configuration is omitted from the structure illustrated in FIG. 3.

As illustrated in FIG. 9, the plurality of transistors Tr (block select transistors 35) have drain regions connected to another transistor Tr functioning as the voltage select transistors 37 (FIG. 1) via conductive members such as the plurality of wirings d0, d1, d2, m0, m1, m2 and the plurality of contacts CS, C1, C2, C4, V0, V1. Hereinafter, the plurality of wirings m2 electrically connected between the two transistors Tr are referred to as "wirings m2a" in some cases. The plurality of wirings d1, d2 and the contacts C1, C2, C4 electrically connected between the block select transistors 35 and the wirings m2a are referred to as "wiring d1a," "wiring d2a," "contact C1a," "contact C2a," and "contact C4a" in some cases, respectively. The plurality of wirings d1a, d2a, m2a and the contacts C1a, C2a, C4a each function as a part of the wiring CG (FIG. 1).

The wiring d1a extends in the Y-direction and are arranged in the X-direction. For example, the number of the wirings d1a may be same as the number of the conductive layers 110 included in one of the memory blocks BLK. In the illustrated example, the wiring d1a are disposed in the hook-up region $R_{HU}$.

The wiring d1a has a lower surface connected to upper ends of a plurality of contacts C1a arranged in the Y-direction. The respective contacts C1a extend in the Z-direction. For example, the number of the contacts C1a may be same as the number of the transistors Tr connected to the wirings d1a or may be smaller than the number of the transistors Tr. For example, in the illustrated example, the number of the contacts C1a is half of the number of the transistors Tr. That is, in the illustrated example, the two transistors arranged in the Y-direction have the drain region in common, and one contact C1a is disposed corresponding to this drain region. The respective wirings d1a are connected to the drain regions of the plurality of transistors Tr via the plurality of contacts C1a.

The wiring d1a has an upper surface connected to the lower end of one contact C2a or the lower ends of a plurality of contacts C2a arranged in the Y-direction. The contacts C2a each extend in the Z-direction and are disposed at an intersection part between the wiring d1a and the wiring d2a. For example, the number of the contacts C4a may be same as the number of the wirings d2a.

The contact C2a has an upper end connected to the wiring d2a. The wirings d2a extend in the X-direction and are arranged in the Y-direction. For example, the number of the wirings d2a may be same as the number of the wirings m2a or may be an integral multiple of the number of the wirings m2a. For example, when the number of the wirings d1a and the number of the wirings m2a are same and the number of the wirings d2a is N times (N is a natural number) the number of the wirings m2a, the N wirings d2a are connected in parallel between one of the wirings d1a and one of the wirings m2a. In the illustrated example, the wirings d2a are disposed from the hook-up region $R_{HU}$ to a region outside the memory cell array region $R_{MCA}$ (FIG. 2).

The wiring d2a has an upper surface connected to a lower end of one contact C4a. The contact C4a extends in the Z-direction and is disposed at an intersection part between the wiring d2a and the wiring m2a. For example, the number of the contacts C4a may be same as the number of the wirings d2a. In the illustrated example, the contacts C4a are disposed in a region outside the memory cell array region $R_{MCA}$ (FIG. 2).

The contact C4a has an upper end connected to the wiring m2a via conductive members such as the wirings m0, m1 and the contacts V0, V1. The wirings m2a extend in the Y-direction and are arranged in the X-direction. For example, the number of the wirings m2a may be same as the number of the conductive layers 110 included in the memory block BLK. Note that, in the illustrated example, the wirings m2a are disposed in a region outside the memory cell array region $R_{MCA}$ (FIG. 2).

Note that the positions of the wirings d2a, the contacts C2a, and the contacts C4a in the Y-direction are appropriately adjustable.

For example, the positions of the wirings d2a, the contacts C2a, and the contacts C4a in the Y-direction may be away from the end portions in the Y-direction of the wirings d1a and the end portions in the Y-direction of the wirings m2a in the Y-direction. For example, in a region on one side in the Y-direction than the wirings d2a, the contacts C2a, and the contacts C4a, one or a plurality of contacts C1a and one or a plurality of transistors Tr (block select transistors 35) may be disposed. Alternatively, in a region on the other side in the Y-direction than the wirings d2a, the contacts C2a, and the contacts C4a, one or a plurality of contacts C1a and one or a plurality of transistors Tr (block select transistors 35) may be disposed.

Figure 10:
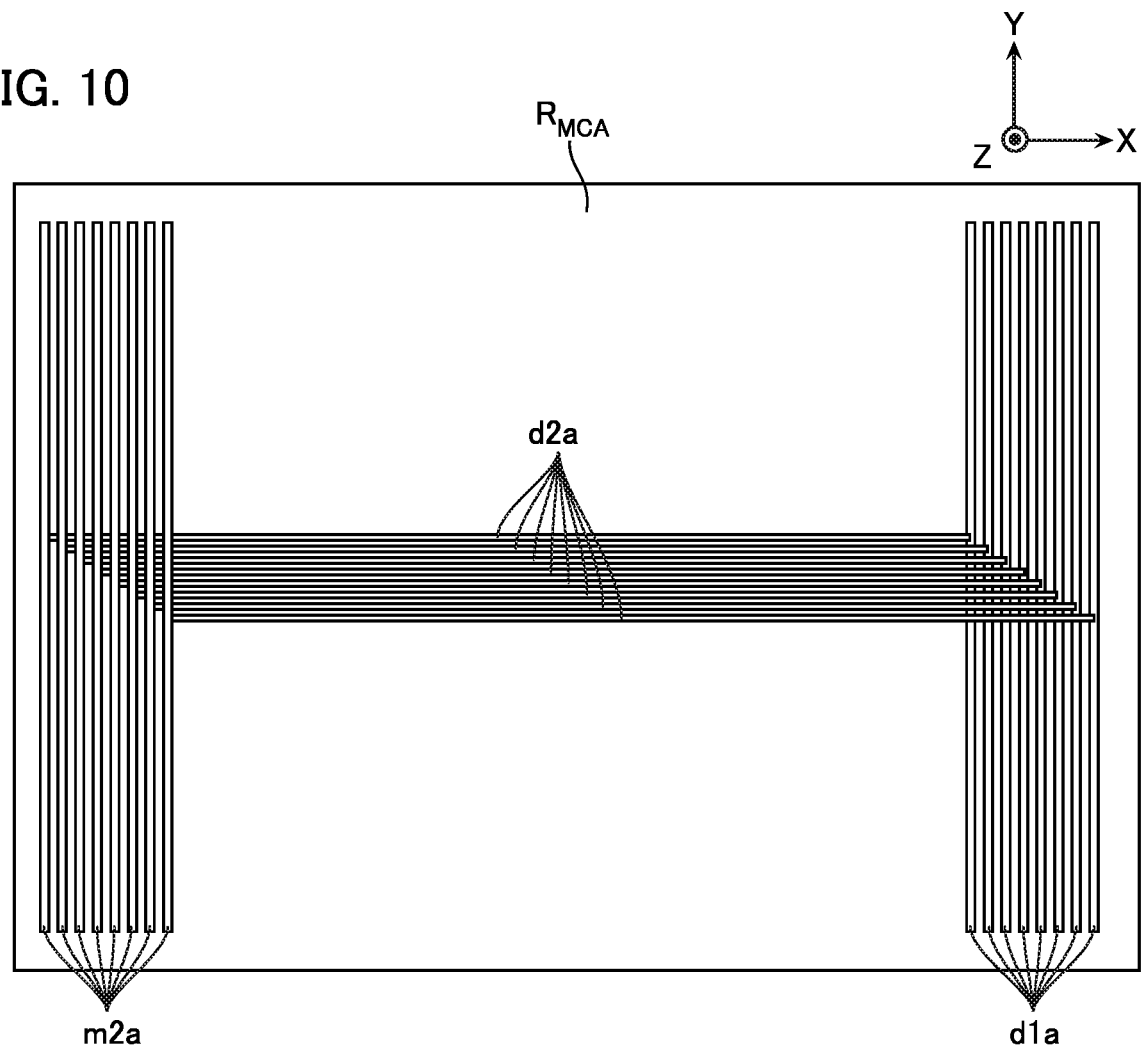
FIG. 10 is a schematic plan view illustrating a first exemplary configuration of the memory die MD.

For example, in the example illustrated in FIG. 10, the number of the wirings d2a is same as the number of the wirings m2a. In such an example, the same number of the wirings d2a, the contacts C2a, and the contacts C4a as the number of the wirings m2a may be disposed in a region near the center (a region including the center position) in the Y-direction in the memory cell array region $R_{MCA}$.

Figure 11:
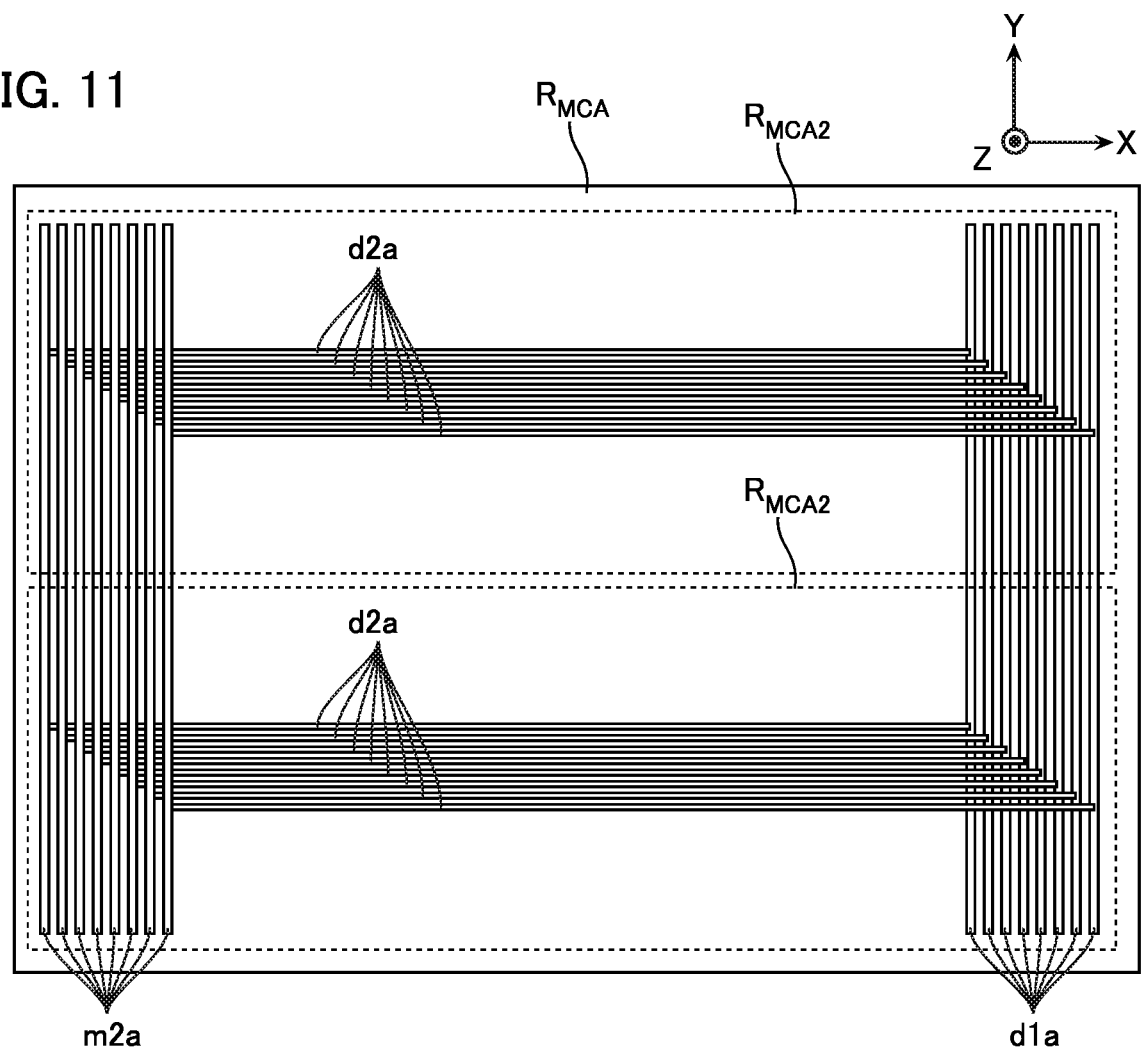
FIG. 11 is a schematic plan view illustrating a second exemplary configuration of the memory die MD.

For example, in the example illustrated in FIG. 11, the number of the wirings d2a is twice the number of the wirings m2a. In such an example, the memory cell array region $R_{MCA}$ may be equally divided into two in the Y-direction to form two regions $R_{MCA2}$. Additionally, the same number of the wirings d2a, the contacts C2a, and the contacts C4a as the number of the wirings m2a may be disposed in respective regions near the center (regions including the center position) in the Y-direction in the two regions $R_{MCA2}$.

Figure 12:
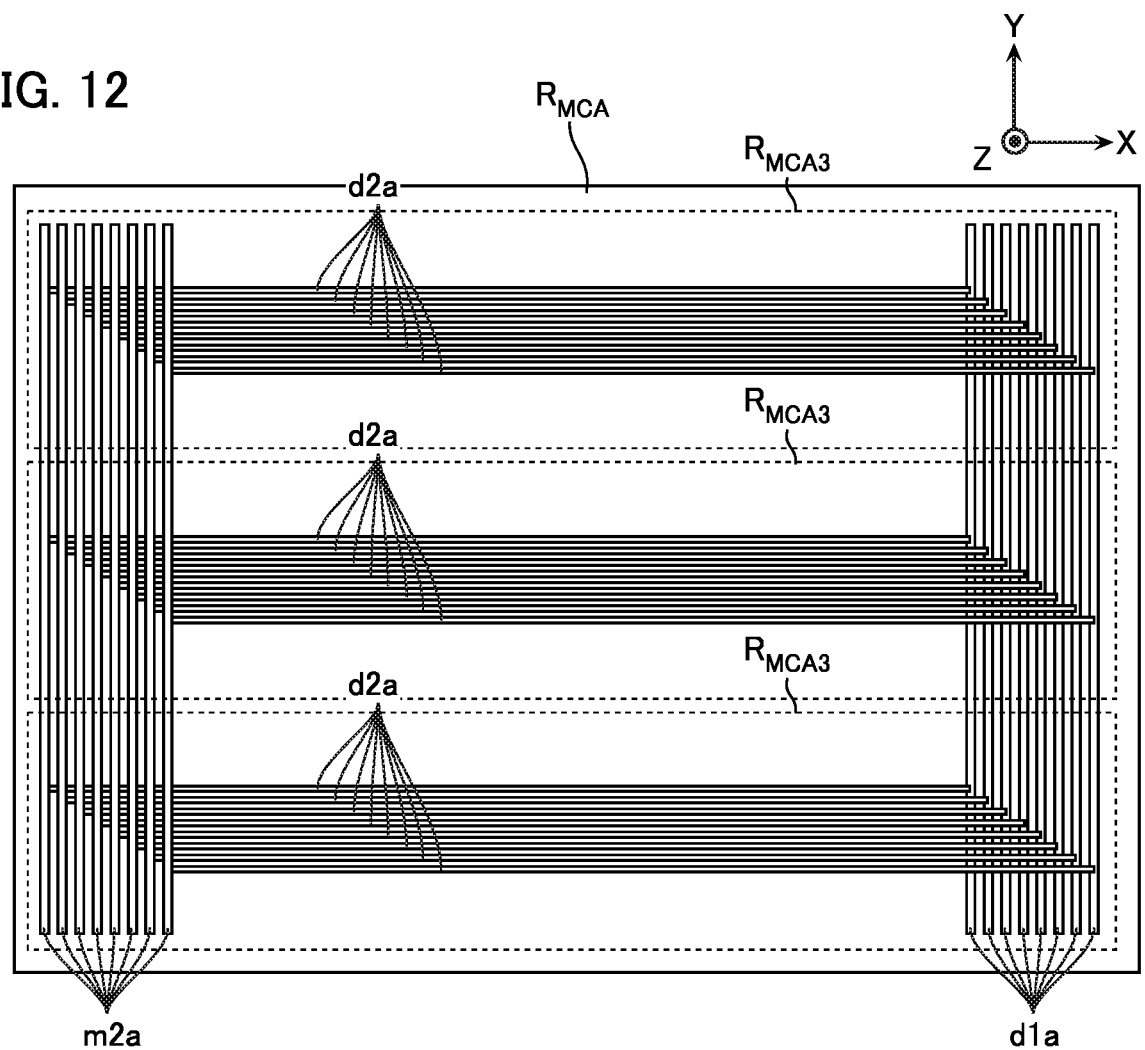
FIG. 12 is a schematic plan view illustrating a third exemplary configuration of the memory die MD.

For example, in the example illustrated in FIG. 12, the number of the wirings d2a is three times the number of the wirings m2a. In such an example, the memory cell array region $R_{MCA}$ may be equally divided into three in the Y-direction to form three regions $R_{MCA3}$. Additionally, the same number of the wirings d2a, the contacts C2a, and the contacts C4a as the number of the wirings m2a may be disposed in respective regions near the center (regions including the center position) in the Y-direction in the three regions $R_{MCA3}$.

Similarly, in an example in which the number of the wirings d2a is N (N is a natural number) times the number of the wirings m2a, the memory cell array region $R_{MCA}$ may be equally divided into N in the Y-direction to form N regions $R_{MCAN}$, and the same number of the wirings d2a, the contacts C2a, and the contacts C4a as the number of the wirings m2a may be disposed in respective regions near the center (regions including the center position) in the Y-direction in the N regions $R_{MCAN}$. Note that these N regions $R_{MCAN}$ may each include the plurality of memory blocks BLK arranged in the Y-direction.

COMPARATIVE EXAMPLES

Figure 13:
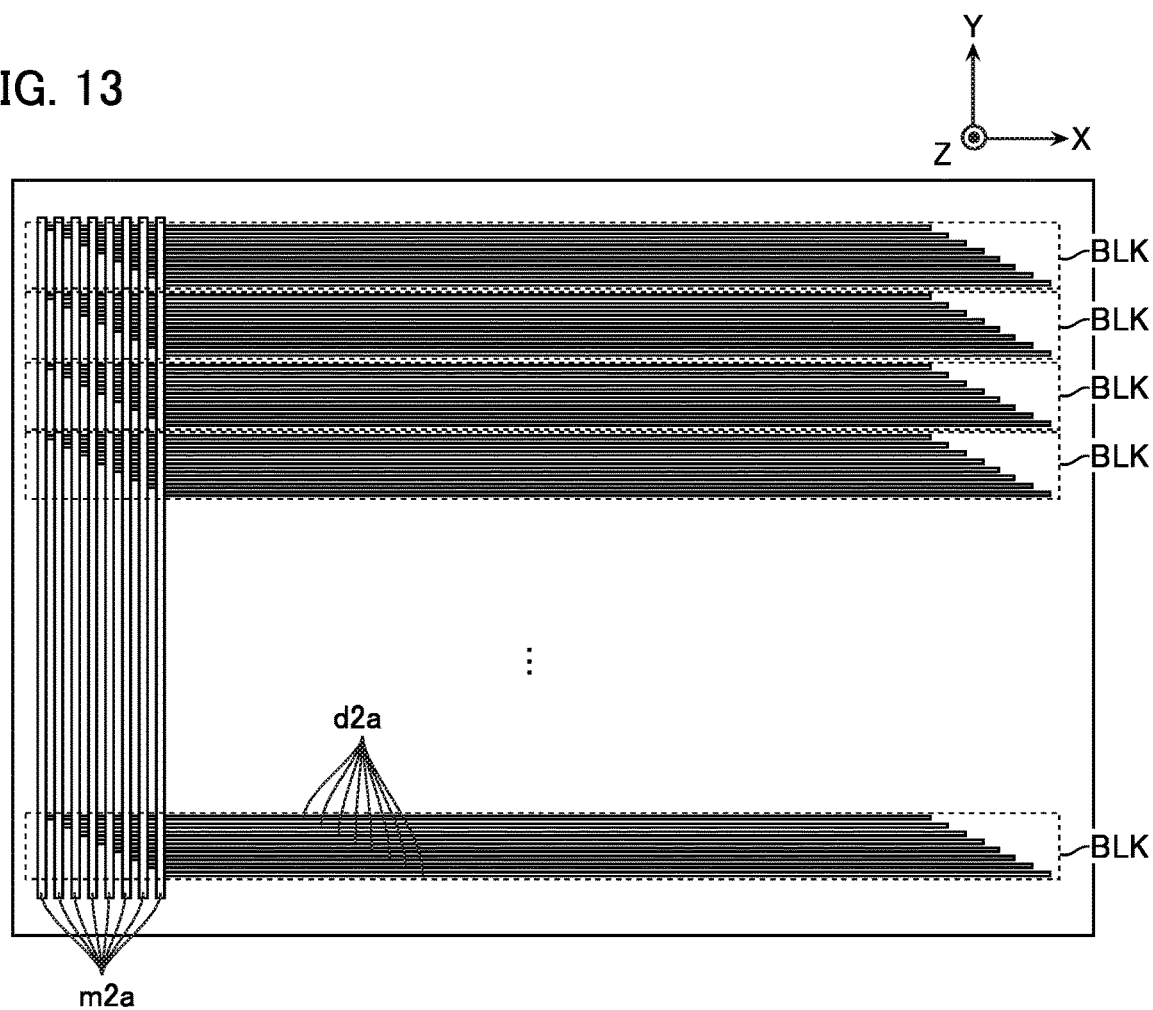
FIG. 13 is a schematic plan view illustrating a configuration of a semiconductor memory device according to a first comparative example.

FIG. 13 illustrates a configuration according to a first comparative example. The configuration according to the first comparative example does not include the wirings d1a as described with reference to FIG. 9. In the configuration according to the first comparative example, numbers of the wirings d2a, the contacts C2a, and the contacts C4a are the same as a number of the contacts C1a. Additionally, the configuration according to the first comparative example includes one wiring d1 corresponding to one contact C1a, and each block select transistor 35 is connected to the wiring m2a via the wiring d1, the wiring d2a, the contact C2a, and the contact C4a. The wirings m2a are connected to the voltage select transistors 37 (not illustrated) at one end portions in the Y-direction.

For example, compared with the configurations illustrated in FIG. 10 to FIG. 12, the number of wirings is large in the configuration, and this results in a complicated wiring pattern and there may be a case where miniaturization is difficult.

Figure 14:
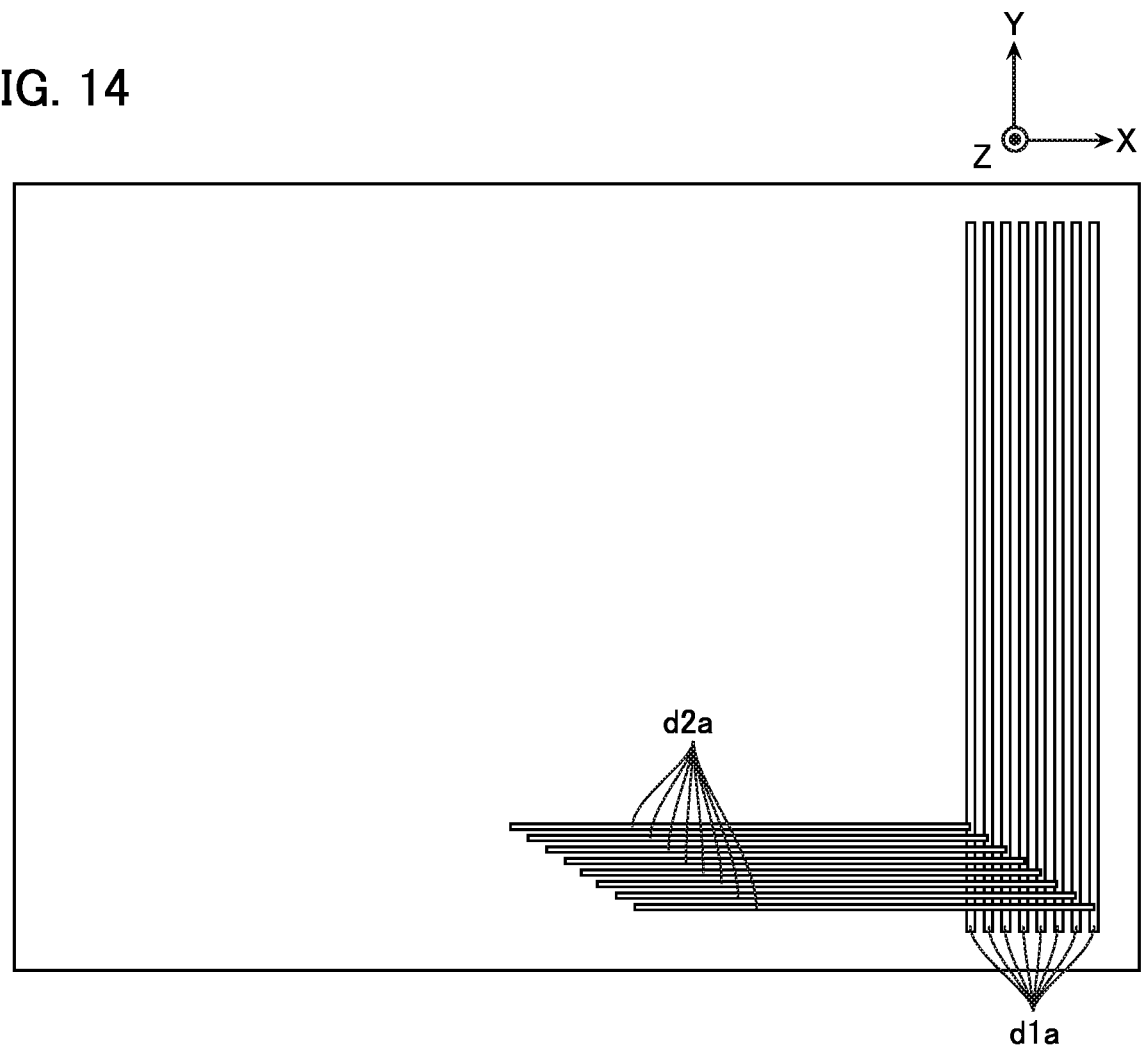
FIG. 14 is a schematic plan view illustrating a configuration of a semiconductor memory device according to a second comparative example.

FIG. 14 illustrates a configuration in a second comparative example. The configuration according to the second comparative example does not include the wirings m2a or the contacts C4a as described with reference to FIG. 9. In the configuration according to the second comparative example, the block select transistors 35 and the voltage select transistors 37 are connected via only a configuration positioned downward of the memory cell array layer $L_{MCA}$. That is, one end portion in the Y-direction of the wiring d1a is connected to one end portion in the X-direction of the wiring d2a, the other end portion in the X-direction of the wiring d2a is positioned near the voltage select transistors 37, and the wiring d2a is connected to the voltage select transistors 37 via the wirings d0, d1, d2 (not illustrated).

The number of wirings in the configuration is smaller than, for example, that of the configuration as illustrated in FIG. 13. This allows performing miniaturization comparatively easily.

Note that the numbers of wirings of the configurations described with reference to FIG. 10 to FIG. 12 are also smaller than that of, for example, the configurations illustrated in FIG. 13. This allows performing miniaturization comparatively easily.

[Wiring Resistance in Wiring CG]

Figure 15:
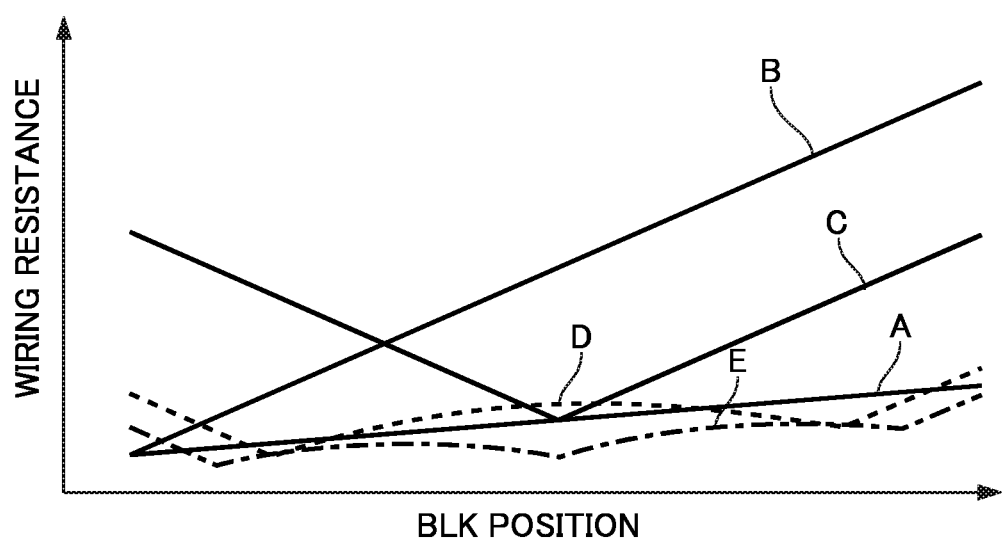
FIG. 15 is a schematic graph to describe a wiring resistance.

FIG. 15 is a schematic graph to describe the wiring resistance in the wiring CG. The horizontal axis indicates positions in the Y-direction of the plurality of memory blocks BLK. The vertical axis indicates the wiring resistance in the wiring CG. The wiring resistance in the wiring CG may be, for example, a wiring resistance between the plurality of conductive layers 110 (FIG. 3) included in each memory block BLK and the voltage select transistors 37 (FIG. 1).

A property indicated by the solid line A in the drawing indicates a property in the first comparative example (FIG. 13). In the first comparative example, the plurality of wirings d2a arranged in the Y-direction are disposed corresponding to the plurality of block select transistors 35 arranged in the Y-direction. The one end portions in the X-direction of the plurality of wirings d2a are connected to the wirings m2a extending in the Y-direction, and the connecting parts between the wirings m2a and the wirings d2a are dispersedly disposed in the Y-direction. Additionally, the wirings m2a are connected to the voltage select transistors 37 via the one end portions in the Y-direction. In the configuration, among the plurality of block select transistors 35, the block select transistor 35 closer to the one end side in the Y-direction has a small voltage drop in the wiring m2a, and the block select transistor 35 closer to the other end side in the Y-direction has a large voltage drop in the wiring m2a. Therefore, as illustrated in FIG. 15, in the first comparative example, the wiring resistance in the wiring CG increases in proportion to the distance from the one end portion in the Y-direction. However, the wiring m2a is made of aluminum (Al), which has a comparatively low resistivity, and the wiring resistance in the wiring m2a is comparatively small. Therefore, a variation of the wiring resistance among the memory blocks BLK is comparatively small in the first comparative example. However, as described above, there may be a case where the configuration according to the first comparative example is difficult to be miniaturized.

A property indicated by the solid line B in the drawing indicates a property in the second comparative example (FIG. 14). In the second comparative example, the plurality of block select transistors 35 arranged in the Y-direction are connected to the wirings d1a extending in the Y-direction in common via the plurality of contacts C1a. Additionally, the wirings d1a are connected to the voltage select transistors 37 via the one end portions in the Y-direction. In the configuration, among the plurality of block select transistors 35, the block select transistor 35 closer to the one end side in the Y-direction has a small voltage drop in the wiring d1a, and the block select transistor 35 closer to the other end side in the Y-direction has a large voltage drop in the wiring d1a. Therefore, as illustrated in FIG. 15, in the second comparative example, the wiring resistance in the wiring CG increases in proportion to the distance from the one end portion in the Y-direction. Here, the wiring d1a is made of tungsten (W), which has a comparatively high resistivity, and the wiring resistance in the wiring d1a is comparatively large. Therefore, in the second comparative example, the variation of the wiring resistance among the memory blocks BLK is comparatively large.

A property indicated by the solid line C in the drawing indicates a property of the configuration illustrated as an example in FIG. 10 of the semiconductor memory device according to the first embodiment. In the configuration, the plurality of block select transistors 35 arranged in the Y-direction are connected to the wirings d1a extending in the Y-direction in common via the plurality of contacts C1a. The wirings d1a are connected to the wirings d2a at the position near the center in the Y-direction of the memory cell array region $R_{MCA}$. Additionally, the one end portions in the X-direction of the wirings d2a are connected to the wirings m2a extending in the Y-direction and are connected to the voltage select transistors 37 via the wirings m2a. In the configuration, among the plurality of block select transistors 35, the block select transistor 35 close to the position near the center in the Y-direction in the memory cell array region $R_{MCA}$ has a small voltage drop in the wiring d1a, and the block select transistor 35 far from the position near the center in the Y-direction has a large voltage drop in the wiring d1a. Therefore, as illustrated in FIG. 15, in this configuration, the wiring resistance in the wiring CG increases in proportion to a distance from the vicinity of the center in the Y-direction in the memory cell array region $R_{MCA}$.

In the configuration, for example, compared with the second comparative example (FIG. 14), a variation of the distances from the block select transistors 35 to the wirings d2a in the Y-direction is decreased, thus ensuring decreasing the variation of the wiring resistances in the wirings d1a. Therefore, in this configuration, the variation of the wiring resistances among the memory blocks BLK can be decreased compared with that of the second comparative example.

A property indicated by the dotted line D in the drawing indicates a property of the configuration illustrated as an example in FIG. 11 of the semiconductor memory device according to the first embodiment. In the configuration, the plurality of block select transistors 35 arranged in the Y-direction are connected to the wirings d1a extending in the Y-direction in common via the plurality of contacts C1a. The wirings d1a are connected to the wirings d2a at the position near the center in the Y-direction in the region $R_{MCA2}$. Additionally, the one end portions in the X-direction of the wirings d2a are connected to the wirings m2a extending in the Y-direction and are connected to the voltage select transistors 37 via the wirings m2a. In the configuration, among the plurality of block select transistors 35, the block select transistor 35 close to the position near the center in the Y-direction in the region $R_{MCA2}$ has a small voltage drop in the wiring d1a and the block select transistor 35 far from the position near the center in the Y-direction has a large voltage drop in the wiring d1a. Therefore, as illustrated in FIG. 15, in this configuration, the wiring resistance in the wiring CG becomes the minimum value or the local minimal value at the position near the center in the Y-direction in the region $R_{MCA2}$. Additionally, the wiring resistance in the wiring CG gradually increases as the distance from the position near the center increases.

In the configuration, for example, compared with the configuration illustrated as an example in FIG. 10, the variation of the distances in the Y-direction from the block select transistors 35 to the wirings d2a is decreased, thus ensuring decreasing the variation of the wiring resistances in the wirings d1a. Therefore, in the configuration, the variation of the wiring resistances among the memory blocks BLK can be smaller than that of the configuration illustrated as an example in FIG. 10. In the configuration, the wirings d1a extending in the Y-direction are connected to the plurality of block select transistors 35 arranged in the Y-direction in common, and the two wirings d2a different in the positions in the Y-direction are connected in parallel between the wirings d1a and the wirings m2a. Accordingly, among the plurality of block select transistors 35 disposed between the two wirings d2, the block select transistor 35 farther from one wiring d2 is closer to the other wiring d2. That is, the block select transistor 35 having a larger wiring resistance to the one wiring d2 has a small wiring resistance to the other wiring d2. Accordingly, the variation of the wiring resistances among the memory blocks BLK can be further effectively decreased.

A property indicated by the dash-dotted line E in the drawing indicates a property of the configuration illustrated as an example in FIG. 12 of the semiconductor memory device according to the first embodiment. In this configuration, the plurality of block select transistors 35 arranged in the Y-direction are connected to the wirings d1a extending in the Y-direction in common via the plurality of contacts C1a. The wirings d1a are connected to the wirings d2a at the position near the center in the Y-direction of the region $R_{MCA3}$. Additionally, the one end portions in the X-direction of the wirings d2a are connected to the wirings m2a extending in the Y-direction and are connected to the voltage select transistors 37 via the wirings m2a. In the configuration, among the plurality of block select transistors 35, the block select transistor 35 close to the position near the center in the Y-direction of the region $R_{MCA3}$ has a small voltage drop in the wiring d1a and the block select transistor 35 far from the position near the center in the Y-direction has a large voltage drop in the wiring d1a. Therefore, as illustrated in FIG. 15, in the configuration, the wiring resistance in the wiring CG becomes the minimum value or the local minimal value at the position near the center in the Y-direction of the region $R_{MCA3}$. Additionally, the wiring resistance in the wiring CG gradually increases as the distance from the position near the center increases.

In the configuration, for example, compared with the configuration illustrated as an example in FIG. 11, the variation of the distances in the Y-direction from the block select transistors 35 to the wirings d2a is decreased, thus ensuring decreasing the variation of the wiring resistances in the wirings d1a. Therefore, in the configuration, the variation of the wiring resistances among the memory blocks BLK can be smaller than that of the configuration illustrated as an example in FIG. 11. In the configuration, the wirings d1a extending in the Y-direction are connected to the plurality of block select transistors 35 arranged in the Y-direction in common, and the three wirings d2a different in the positions in the Y-direction are connected in parallel between the wirings d1a and the wirings m2a. Accordingly, among the plurality of block select transistors 35 disposed between the two wirings d2, the block select transistor 35 far from one wiring d2 is close to the other wiring d2. That is, the block select transistor 35 having a large wiring resistance to the one wiring d2 has a small wiring resistance to the other wiring d2. Accordingly, the variation of the wiring resistances among the memory blocks BLK can be further effectively decreased.

Second Embodiment

Figure 16:
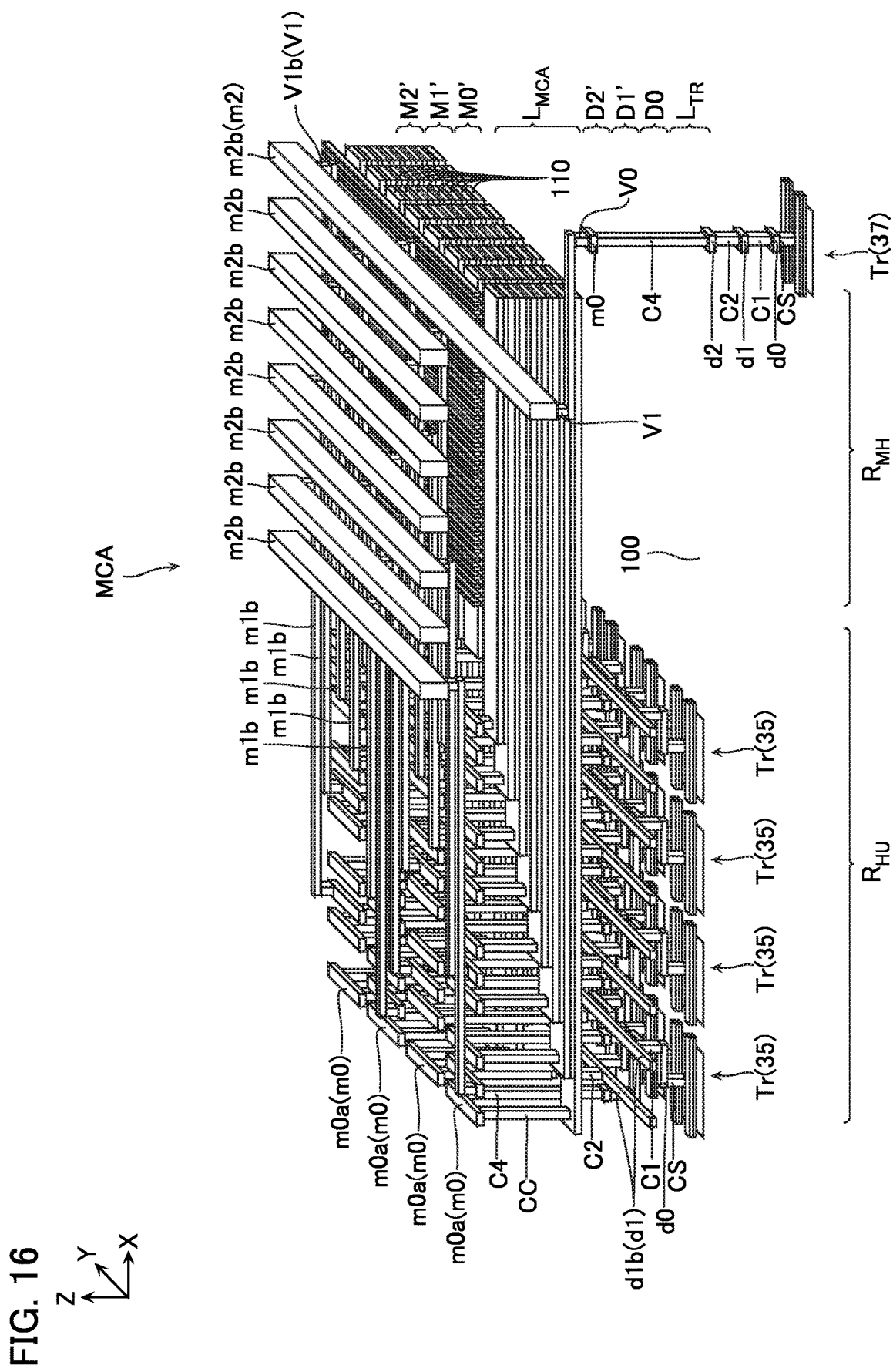
FIG. 16 is a schematic perspective view illustrating a configuration of a semiconductor memory device according to a second embodiment.
Figure 17:
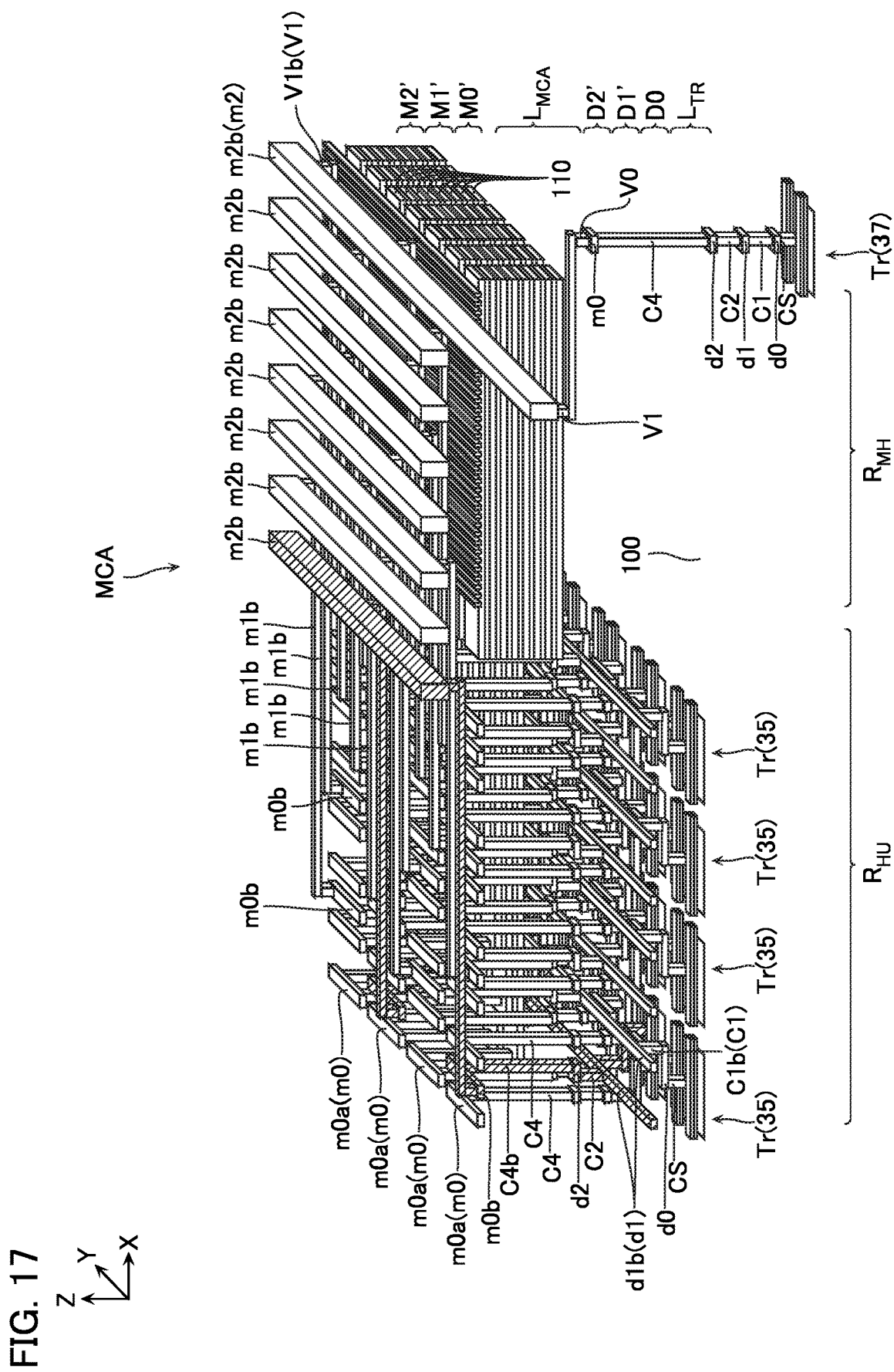
FIG. 17 is a schematic perspective view in which a part of a configuration is omitted from the structure illustrated in FIG. 16.

FIG. 16 is a schematic perspective view illustrating a configuration of a part of a semiconductor memory device according to the second embodiment. FIG. 17 is a schematic perspective view in which a part of a configuration is omitted from the structure illustrated in FIG. 16. In FIG. 17, hatched lines are drawn to one wiring m2b among the plurality of wirings m2b arranged in the X-direction and the plurality of wirings and contacts that electrically conduct to the wiring m2b.

The semiconductor memory device according to the second embodiment is configured basically similarly to the semiconductor memory device according to the first embodiment. However, the semiconductor memory device according to the second embodiment does not include the wiring layers D1, D2, M0, M1, M2, but instead includes wiring layers D1', D2', M0', M1', M2'. The wiring layers D1', D2', M0', M1', M2' are configured basically similarly to the wiring layers D1, D2, M0, M1, M2 according to the first embodiment. However, a layout pattern of the wiring layers D1', D2', M0', M1', M2' according to the second embodiment differs from a layout pattern of the wiring layers D1, D2, M0, M1, M2 according to the first embodiment.

As illustrated in FIG. 16, the drain regions of the plurality of transistors Tr functioning as the block select transistors 35 (FIG. 1) are electrically connected to another transistor Tr functioning as the voltage select transistors 37 (FIG. 1) via conductive members such as the plurality of wirings d0, d1, d2, m0, m1, m2 and the plurality of contacts CS, C1, C2, C4, V0, V1. Hereinafter, the plurality of wirings m2 electrically connected between the two transistors Tr are referred to as "wirings m2b" in some cases. Additionally, the plurality of wirings d1, m0, m1 and contacts C1, C4, V1 electrically connected between the block select transistors 35 and the wirings m2b are referred to as "wiring d1b," "wiring m0b" (FIG. 17), "wiring m1b," "contact C1b" (FIG. 17), "contact C4b" (FIG. 17), and "contact V1b" in some cases, respectively. The plurality of wirings d1b, m0b, m1b, m2b and contacts C1b, C4b, V1b each function as a part of the wiring CG (FIG. 1). In the illustrated example, the transistor Tr functioning as the voltage select transistors 37 (FIG. 1) and the contact C4 electrically connected between the voltage select transistors 37 and the wiring m2b are disposed in the contact connect region $R_{C4T}$ (FIG. 2).

The wirings d1b extend in the Y-direction and are arranged in the X-direction. For example, the number of the wirings d1b may be same as the number of the conductive layers 110 included in the memory block BLK. In the illustrated example, the wirings d1b are disposed in the hook-up region $R_{HU}$.

The wirings d1b have lower surfaces connected to upper ends of the plurality of contacts C1b (FIG. 17) arranged in the Y-direction. The respective contacts C1b extend in the Z-direction. For example, the number of the contacts C1b may be same as the number of the transistors Tr connected to the wirings d1b or may be smaller than the number of the transistors Tr. For example, in the illustrated example, the number of the contacts C1b is the half of the number of the transistors Tr. The respective wirings d1b are connected to the drain regions of the plurality of transistors Tr via the plurality of contacts C1b.

The wirings d1b have upper surfaces connected to a lower end of one contact C4b or lower ends of the plurality of contacts C4b arranged in the Y-direction via conductive members such as the wirings d2 and the like. The respective contacts C4b extend in the Z-direction and are disposed at intersection parts between the wirings d1b and the wirings m0b. In the illustrated example, the contact C4b is disposed between the two contacts C4 arranged in the X-direction. The two contacts C4 have upper ends each connected to the wiring m0a. For example, the number of the contacts C4b may be same as the number of the wirings m0b. Note that in the illustrated example, the contacts C4b are disposed in the hook-up region $R_{HU}$ (FIG. 2).

The contact C4b has an upper end connected to the wiring m0b. The wirings m0b extend in the Y-direction and are arranged in the X-direction. In the illustrated example, the wiring m0b is disposed between the two wirings m0a arranged in the X-direction. For example, the number of the wirings m0b may be same as the number of the wirings m1b. In the illustrated example, the wirings m0b are disposed in the hook-up region $R_{HU}$.

The wiring m0b has an upper surface connected to the wiring m1b via the contact V0. The wirings m1b extend in the X-direction and are arranged in the Y-direction. For example, the number of the wirings m1b may be same as the number of the wirings m2b or may be an integral multiple of the number of the wirings m2b. For example, in a case where the number of the wirings d1b is same as the number of the wirings m2b and where the number of the wirings m1b is N times (N is a natural number) the number of the wirings m2b, the N wirings m1b are connected in parallel between the wiring d1b and the wiring m2b. In the illustrated example, the wirings m1b are disposed from the hook-up region $R_{HU}$ to the memory cell array region $R_{MCA}$ (FIG. 2).

The wiring m1b has an upper surface connected to a lower end of one contact V1b. The contact V1b extends in the Z-direction and is disposed at an intersection part between the wiring m1b and the wiring m2b. For example, the number of the contacts V1b may be same as the number of the wirings m1b. In the illustrated example, the contacts V1b are disposed in the memory cell array region $R_{MCA}$.

The contact V1b has an upper end connected to the wiring m2b. The wirings m2b extend in the Y-direction and are arranged in the X-direction. For example, the number of the wirings m2b may be same as the number of the conductive layers 110 included in the memory block BLK. In the illustrated example, the wirings m2b are disposed in the memory cell array region $R_{MCA}$ (FIG. 2).

Positions of the wirings m0b, the wirings m1b, the contacts C4b, and the contacts V1b in the Y-direction are appropriately adjustable.

For example, the positions of the wirings m0b, the wirings m1b, the contacts C4b, and the contacts V1b in the Y-direction may be away from the end portions in the Y-direction of the wirings d1b and the end portions in the Y-direction of the wirings m2b in the Y-direction.

For example, in an example in which the number of the wirings m1b is N (N is a natural number) times the number of the wirings m2b, the memory cell array region $R_{MCA}$ may be equally divided into N in the Y-direction to form the N regions $R_{MCAN}$, and the same number of the wirings m0b, the wirings m1b, the contacts C4b, and the contacts V1b as the number of the wirings m2b may be disposed in respective regions near the center (regions including the center position) in the Y-direction of the N regions $R_{MCAN}$.

Third Embodiment

Figure 18:
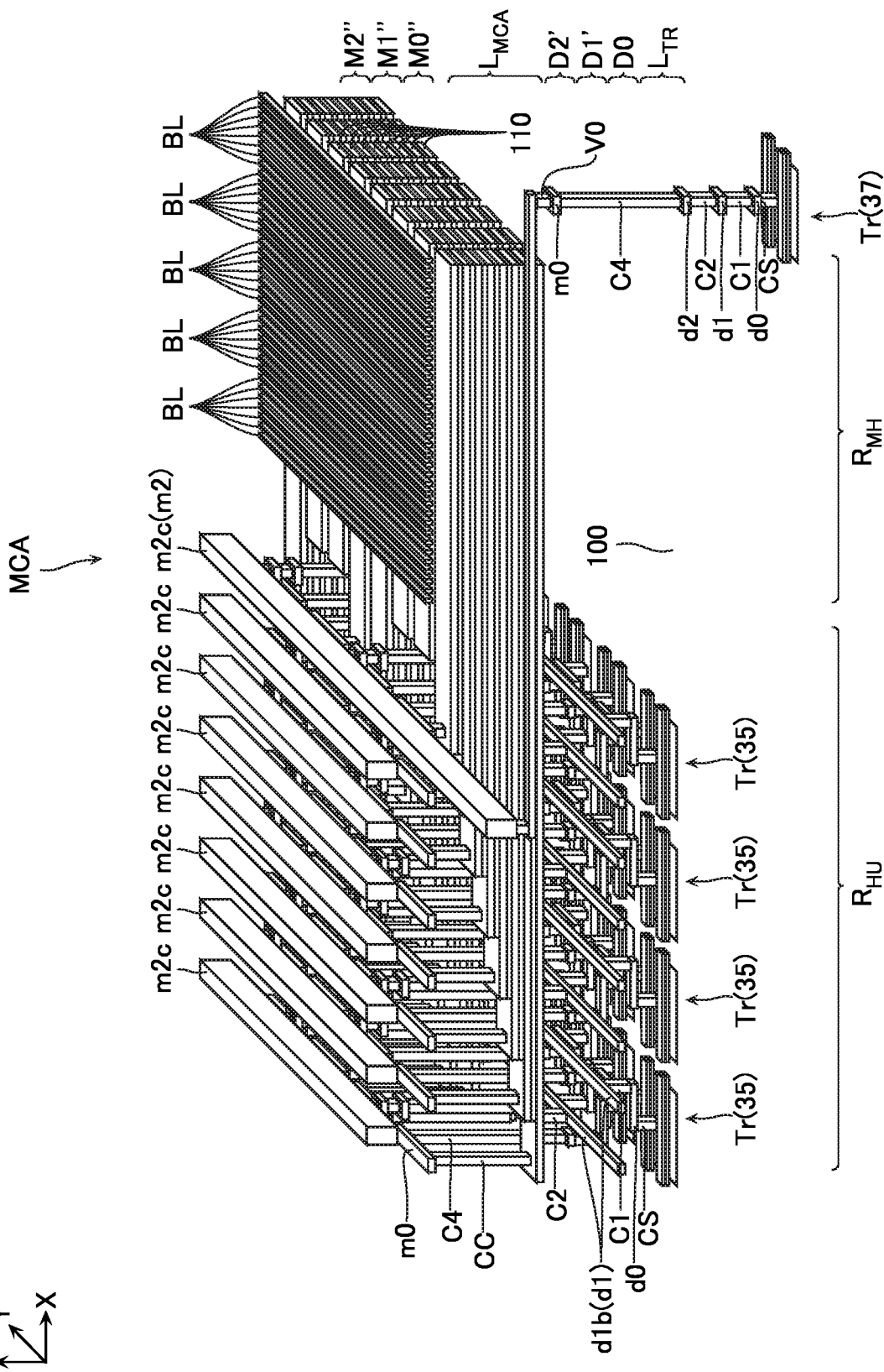
FIG. 18 is a schematic perspective view illustrating a configuration of a semiconductor memory device according to a third embodiment.
Figure 19:
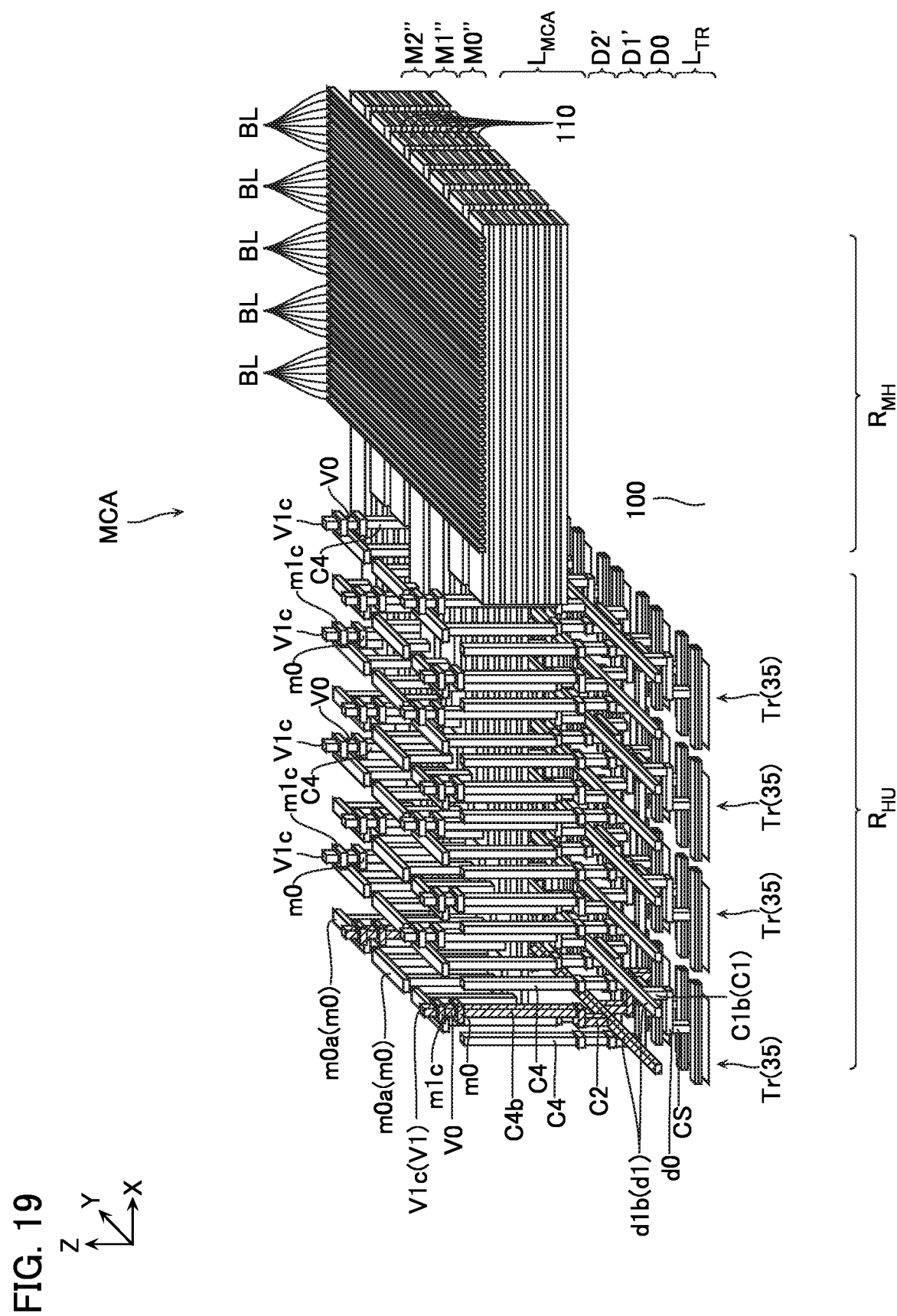
FIG. 19 is a schematic perspective view in which a part of a configuration is omitted from the structure illustrated in FIG. 18.

FIG. 18 is a schematic perspective view illustrating a configuration of a part of a semiconductor memory device according to the third embodiment. FIG. 19 is a schematic perspective view in which a part of the configuration is omitted from the structure illustrated in FIG. 18. In FIG. 19, hatched lines are drawn to the plurality of wirings and contacts that electrically conduct to one wiring m2c among the plurality of wirings m2c illustrated as an example in FIG. 18.

The semiconductor memory device according to the third embodiment is configured basically similarly to the semiconductor memory device according to the second embodiment. However, the semiconductor memory device according to the third embodiment does not include the wiring layers M0', M1', M2' but instead includes wiring layers M0", M1", M2". The wiring layers M0", M1", M2" are configured basically similarly to the wiring layers M0', M1', M2' according to the second embodiment. However, a layout pattern of the wiring layers M0", M1", M2" according to the third embodiment differs from the layout pattern of the wiring layers M0', M1', M2' according to the second embodiment.

As illustrated in FIG. 18, the drain regions of the plurality of transistors Tr functioning as the block select transistors 35 (FIG. 1) are electrically connected to the other transistors Tr (FIG. 18) functioning as the voltage select transistors 37 (FIG. 1) via conductive members such as the plurality of wirings d0, d1, d2, m0, m1, m2, and the plurality of contacts C1, C4, V1 (FIG. 19). Hereinafter, the plurality of wirings m2 electrically connected between the two transistors Tr are referred to as "wirings m2c" in some cases. Additionally, the plurality of wirings m1 and contacts V1 electrically connected between the block select transistors 35 and the wirings m2c are referred to as "wirings m1c" (FIG. 19) and "contacts V1c" (FIG. 19) in some cases, respectively. The plurality of wirings m1c, m2c and the contacts V1c each function as a part of the wiring CG (FIG. 1). In the illustrated example, the transistor Tr functioning as the voltage select transistors 37 (FIG. 1) and the contact C4 electrically connected between the voltage select transistors 37 and the wiring m2c are disposed in the contact connect region $R_{C4T}$ (FIG. 2).

The contact C4b according to the third embodiment has an upper end connected to the contact V1c via conductive members such as the wirings m0, m1c (FIG. 19) and the like. The contacts V1c extend in the Z-direction and are disposed at positions corresponding to the wirings d1b and the wirings m2c (FIG. 18). For example, the number of the contacts V1c may be same as the number of the wirings m2c or may be an integral multiple of the number of the wirings m2c. For example, when the number of the wirings d1b is same as the number of the wirings m2c and when the number of the contacts V1c is N times (N is a natural number) the number of the wirings m2c, the N contacts C4b, V1c are connected in parallel between the wiring d1b and the wiring m2c. In the illustrated example, the contacts V1c are disposed in the hook-up region $R_{HU}$.

The contact V1c has an upper end connected to the wiring m2c (FIG. 18). The wirings m2c extend in the Y-direction and are arranged in the X-direction. For example, the number of the wirings m2c may be same as the number of the conductive layers 110 included in the memory block BLK. In the illustrated example, the wirings m2c are disposed in the hook-up region $R_{HU}$ (FIG. 2).

Note that the positions of the wirings m1c, the contacts C4b, and the contacts V1c in the Y-direction are appropriately adjustable.

For example, the positions of the wirings m1c, the contacts C4b, and the contacts V1c in the Y-direction may be away from the end portions in the Y-direction of the wirings d1b and the end portions in the Y-direction of the wirings m2c in the Y-direction.

For example, in an example in which the numbers of the wirings m1c, the contacts C4b, and the contacts V1c are N (N is a natural number) times the number of the wirings d1b, the memory cell array region $R_{MCA}$ may be equally divided into N in the Y-direction to form N regions $R_{MCAN}$, and the same number of the wirings m1c, the contacts C4b, and the contacts V1c as the number of the wirings d1b may be disposed in respective regions near the center (regions including the center position) in the Y-direction of the N regions $R_{MCAN}$.

Other Embodiments

The semiconductor memory devices according to the first embodiment to the third embodiment have been described above. However, the semiconductor memory devices according to these embodiments are merely examples, and the specific configuration, the operation, and the like are appropriately adjustable.

For example, in the first embodiment to the third embodiment, all of the wirings d1a, d1b, m2a, m2b, m2c extend in one direction from the one end to the other end of the memory cell array region $R_{MCA}$ in the Y-direction. However, this configuration is merely one example and the specific configuration is appropriately adjustable. For example, the wirings d1a, d1b, m2a, m2b, m2c may include a part extending in the X-direction. The wiring d1a, d1b, m2a, m2b, m2c may be formed in substantially straight lines via wirings of other wiring layers or the like.

Figure 20:
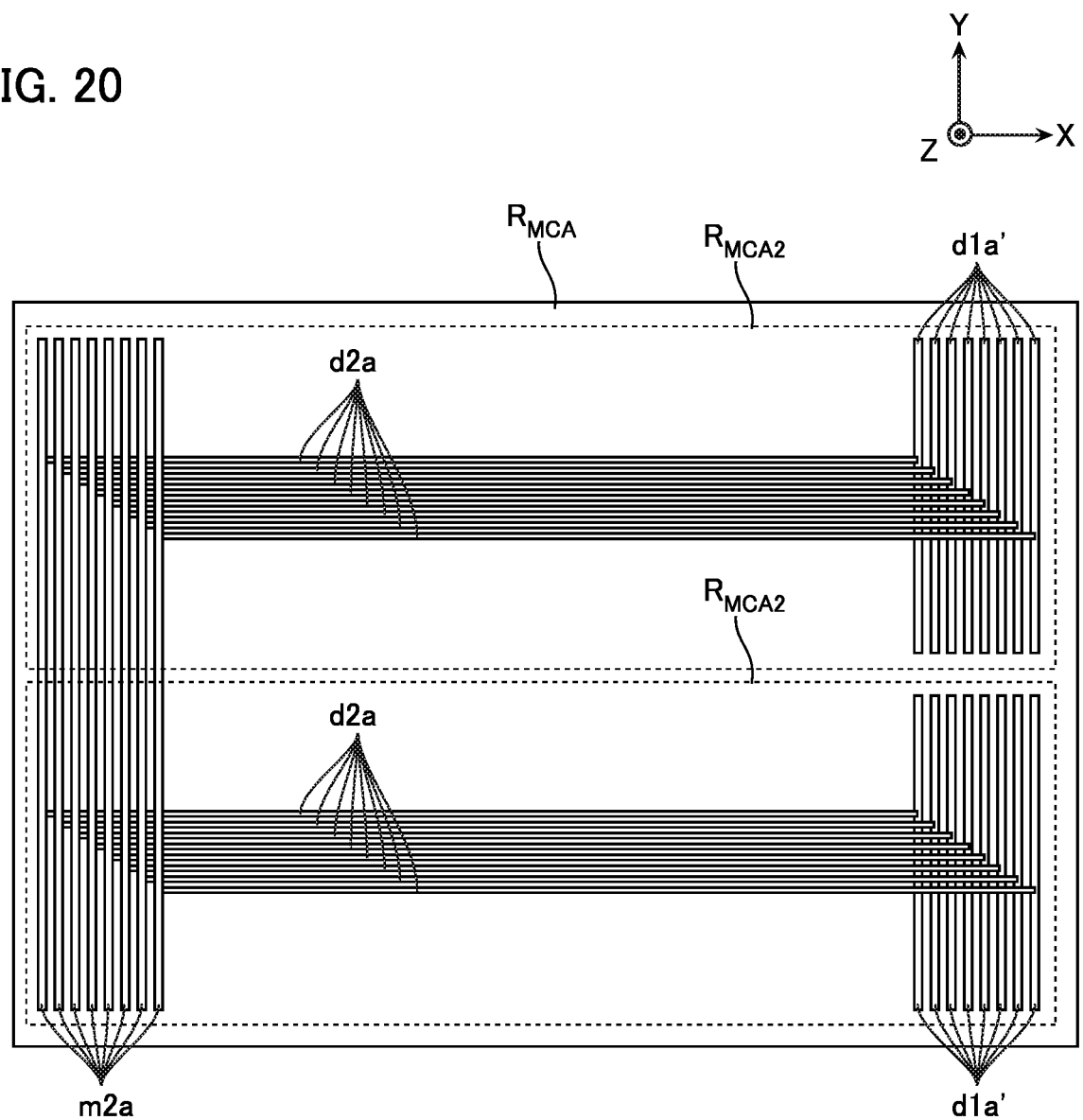
FIG. 20 is a schematic plan view illustrating a configuration of a semiconductor memory device according to another embodiment.
Figure 21:
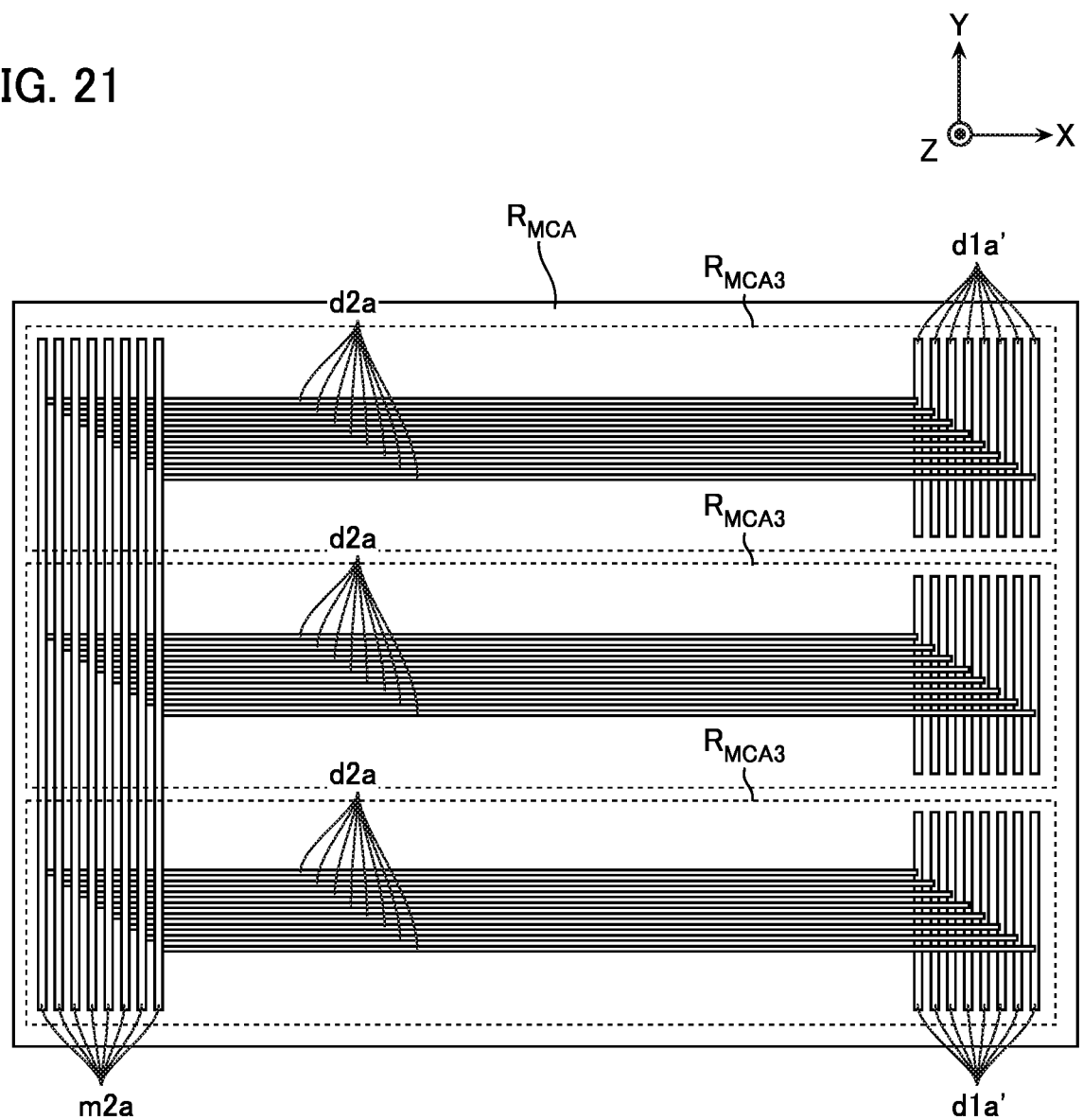
FIG. 21 is a schematic plan view illustrating a configuration of a semiconductor memory device according to another embodiment.

Moreover, for example, in the first embodiment to the third embodiment, both of the wirings d1a, d1b are formed of one wiring that is continuously formed. However, this configuration is merely one example and the specific configuration is appropriately adjustable. For example, in a case where the number of the wirings d2a is N times the number of the wirings m2a in the first embodiment, as illustrated as an example in FIG. 20 or FIG. 21, the wirings d1a may be divided into N or less of wirings d1a' in the Y-direction. That is, instead of the wiring d1a, the N or less wirings d1a' arranged in the Y-direction may be disposed. The respective wirings d1a' are electrically connected between the wirings m2a and the block select transistors 35. Similarly, when the number of the wirings m1b is N times the number of the wirings m2b in the second embodiment or when the number of the contacts V1c is N times the number of the wirings m2c in the third embodiment, the wiring d1b may be divided into N or less wirings in the Y-direction.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate;
   a plurality of memory blocks spaced from the semiconductor substrate in a first direction intersecting with a surface of the semiconductor substrate, the plurality of memory blocks being arranged in a second direction intersecting with the first direction;
   a first wiring that is farther from the semiconductor substrate than the plurality of memory blocks in the first direction;
   a second wiring that is closer to the semiconductor substrate than the plurality of memory blocks in the first direction;
   a first contact, the first wiring being electrically connected to the second wiring via the first contact;
   a first transistor with a first active region disposed in the semiconductor substrate, the second wiring being electrically connected to a first memory block among the plurality of memory blocks via the first transistor; and
   a second transistor with a second active region disposed in the semiconductor substrate, the second wiring being electrically connected to a second memory block among the plurality of memory blocks via the second transistor, wherein
   the first contact is positioned between the first transistor and the second transistor in the second direction.

2. The semiconductor memory device according to claim 1, comprising
   a third transistor with a third active region disposed in the semiconductor substrate, the second wiring being electrically connected to a third memory block among the plurality of memory blocks via the third transistor; and
   a fourth transistor with a fourth active region disposed in the semiconductor substrate, the second wiring being electrically connected to a fourth memory block among the plurality of memory blocks via the fourth transistor, wherein
   the first contact is disposed between the third transistor and the fourth transistor in the second direction.

3. The semiconductor memory device according to claim 1, comprising:
   a third wiring that is closer to the semiconductor substrate than the plurality of memory blocks in the first direction, the third wiring having a position different from a position of the second wiring in the second direction;
   a third contact, the first wiring being electrically connected to the third wiring via the third contact, the third contact having a position different from a position of the first contact in the second direction;
   a sixth transistor with a sixth active region disposed in the semiconductor substrate, the third wiring being electrically connected to a sixth memory block among the plurality of memory blocks via the sixth transistor; and
   a seventh transistor with a seventh active region disposed in the semiconductor substrate, the third wiring being electrically connected to a seventh memory block among the plurality of memory blocks via the seventh transistor, wherein
   the third contact is disposed between the sixth transistor and the seventh transistor in the second direction.

4. The semiconductor memory device according to claim 3, wherein
   the second wiring and the third wiring are arranged in the second direction.

5. The semiconductor memory device according to claim 1, wherein
   each of the plurality of memory blocks includes:
      a plurality of conductive layers arranged in the first direction;
      a semiconductor layers extending in the first direction and opposed to the plurality of conductive layers; and
      a gate insulating layers disposed between the plurality of conductive layers and the semiconductor layers.

6. The semiconductor memory device according to claim 1, wherein
   the first wiring has a connecting surface connected to the first contact via one or a plurality of conductive members.

7. The semiconductor memory device according to claim 1, wherein
   the second wiring has a connecting surface connected to the first contact via one or a plurality of conductive members.

8. The semiconductor memory device according to claim 1, wherein
   the first wiring has a resistance value per unit length smaller than a resistance value per unit length of the second wiring.

9. The semiconductor memory device according to claim 1, wherein
   the first wiring extends in the second direction,
   the second wiring extends in the second direction,
   a width of the first wiring in a third direction intersecting with the first direction and the second direction is greater than a width of the second wiring in the third direction.

10. The semiconductor memory device according to claim 1, wherein
    the first wiring contains copper or aluminum, and the second wiring contains tungsten.

11. The semiconductor memory device according to claim 6, comprising:
    a third region including the semiconductor layers; and
    a fourth region arranged with the third region in a third direction intersecting with the first direction and the second direction, wherein
    at least a part of the first wiring is disposed in the third region.

12. The semiconductor memory device according to claim 6, comprising:
- a third region including the semiconductor layers; and
- a fourth region arranged with the third region in a third direction intersecting with the first direction and the second direction; and
- an eighth transistor with an eighth active region disposed in the semiconductor substrate, the eighth transistor being electrically connected to the first memory block via the first wiring and the second wiring, wherein
- the eighth transistor is disposed in the third region.

13. The semiconductor memory device according to claim 1, wherein
- the first wiring extends in the second direction, and
- the second wiring extends in the second direction.

14. A semiconductor memory device comprising:
- a semiconductor substrate;
- a plurality of memory blocks spaced from the semiconductor substrate in a first direction intersecting with a surface of the semiconductor substrate, the plurality of memory blocks being arranged in a second direction intersecting with the first direction;
- a bit line overlapping the plurality of memory blocks and extending in the second direction;
- a first wiring that is farther from the semiconductor substrate than the plurality of memory blocks and the bit line in the first direction and extending in the second direction;
- a second wiring that is closer to the semiconductor substrate than the plurality of memory blocks in the first direction, and extending in the second direction, and the first wiring and the second wiring are in parallel;
- a third wiring extending in a third direction intersecting with the first direction and the second direction;
- a first contact, the first wiring being electrically connected to the second wiring via the first contact and the third wiring;
- a first transistor with a first active region disposed in the semiconductor substrate, the second wiring being electrically connected to a first memory block among the plurality of memory blocks via the first transistor; and
- a second transistor with a second active region disposed in the semiconductor substrate, the second wiring being electrically connected to a second memory block among the plurality of memory blocks via the second transistor, wherein the first contact is disposed between the first transistor and the second transistor in the second direction, wherein a first part of the third wiring overlaps the plurality of memory blocks and a second part of the third wiring overlaps the first transistor and the second transistor.

* * * * *